United States Patent
Murakami et al.

(10) Patent No.: US 9,761,788 B2
(45) Date of Patent: *Sep. 12, 2017

(54) PIEZOELECTRIC MATERIAL, PIEZOELECTRIC ELEMENT, AND ELECTRONIC APPARATUS

(71) Applicant: CANON KABUSHIKI KAISHA, Tokyo (JP)

(72) Inventors: Shunsuke Murakami, Kawasaki (JP); Takanori Matsuda, Chofu (JP); Kanako Oshima, Tokyo (JP); Jumpei Hayashi, Yokohama (JP); Takayuki Watanabe, Yokohama (JP); Hidenori Tanaka, Yokohama (JP); Hiroshi Saito, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 129 days.

This patent is subject to a terminal disclaimer.

(21) Appl. No.: 14/329,573

(22) Filed: Jul. 11, 2014

(65) Prior Publication Data

US 2015/0041701 A1 Feb. 12, 2015

(30) Foreign Application Priority Data

Jul. 12, 2013 (JP) .................................. 2013-146307

(51) Int. Cl.
*H01L 41/187* (2006.01)
*C04B 35/468* (2006.01)
(Continued)

(52) U.S. Cl.
CPC .......... *H01L 41/183* (2013.01); *B06B 1/0644* (2013.01); *B41J 2/14209* (2013.01);
(Continued)

(58) Field of Classification Search
CPC ............. H01L 41/1871; C04B 35/4682; C04B 35/462; C04B 35/468; C04B 35/499;
(Continued)

(56) References Cited

U.S. PATENT DOCUMENTS 7,531,939 B2 * 5/2009 Takiguchi ............ H04B 13/005
310/311
9,144,971 B2 * 9/2015 Watanabe ............ B41J 2/14201
(Continued)

FOREIGN PATENT DOCUMENTS

CN 1635592 A 7/2005
EP 2749550 A2 7/2014
(Continued)

OTHER PUBLICATIONS

T. Karaki, S. Maruyama, R. Chikazawa & M. Adachi, Modified BaTiO3 Piezoelectric Ceramics with Bi2O3-Li2O Ferroelectrics, vol. 439, p. 83-87.

(Continued)

*Primary Examiner* — Matthew E Hoban
*Assistant Examiner* — Lynne Edmondson
(74) *Attorney, Agent, or Firm* — Canon U.S.A., Inc. IP Division

(57) ABSTRACT

Provided is a lead-free piezoelectric material having satisfactory piezoelectric constant and mechanical quality factor in a device driving temperature range (−30° C. to 50° C.) The piezoelectric material includes a main component containing a perovskite-type metal oxide represented by Formula 1, a first auxiliary component composed of Mn, and a second auxiliary component composed of Bi or Bi and Li. The content of Mn is 0.040 parts by weight or more and 0.500 parts by weight or less based on 100 parts by weight of the metal oxide on a metal basis. The content of Bi is 0.042 parts by weight or more and 0.850 parts by weight or (Continued)

less and the content of Li is 0.028 parts by weight or less (including 0 parts by weight) based on 100 parts by weight of the metal oxide on a metal basis.

$(Ba_{1-x}Ca_x)_a(Ti_{1-y}Zr_y)O_3$ ... (1), wherein, $0.030 \leq x < 0.090$, $0.030 \leq y \leq 0.080$, and $0.9860 \leq a \leq 1.0200$.

26 Claims, 15 Drawing Sheets

(51) Int. Cl.
| | |
|---|---|
| H01L 41/18 | (2006.01) |
| H01L 41/09 | (2006.01) |
| B06B 1/06 | (2006.01) |
| B41J 2/14 | (2006.01) |
| H01L 41/047 | (2006.01) |
| H01L 41/083 | (2006.01) |
| H02N 2/10 | (2006.01) |
| H02N 2/16 | (2006.01) |

(52) U.S. Cl.
CPC ....... *B41J 2/14233* (2013.01); *C04B 35/4682* (2013.01); *H01L 41/0471* (2013.01); *H01L 41/0477* (2013.01); *H01L 41/083* (2013.01); *H01L 41/09* (2013.01); *H01L 41/0973* (2013.01); *H01L 41/1871* (2013.01); *H02N 2/106* (2013.01); *H02N 2/163* (2013.01); *B41J 2002/14217* (2013.01); *B41J 2002/14258* (2013.01); *B41J 2202/03* (2013.01); *C04B 2235/3203* (2013.01); *C04B 2235/3208* (2013.01); *C04B 2235/3244* (2013.01); *C04B 2235/3262* (2013.01); *C04B 2235/3298* (2013.01); *C04B 2235/3409* (2013.01); *C04B 2235/3418* (2013.01); *C04B 2235/5445* (2013.01); *C04B 2235/77* (2013.01); *C04B 2235/785* (2013.01); *C04B 2235/786* (2013.01); *C04B 2235/79* (2013.01)

(58) Field of Classification Search
CPC .... C04B 2235/3206; C04B 2235/3262; C04B 2235/3236; C04B 2235/768; C04B 2235/77; C04B 2235/785; C04B 2235/786; C04B 2235/3248; C04B 2235/781; C01G 23/006; C01G 23/003; C01G 25/006; C01P 2002/34
USPC ............ 252/62.9 PZ, 62.9 R; 501/134–138; 310/358
See application file for complete search history.

(56) References Cited

U.S. PATENT DOCUMENTS

| | | | | |
|---|---|---|---|---|
| 9,159,903 | B2* | 10/2015 | Oshima | ............... B41J 2/14233 |
| 9,166,140 | B2* | 10/2015 | Tanaka | ............... H01L 41/0973 |
| 2003/0147194 | A1* | 8/2003 | Hibi | ...................... B32B 18/00 |
| | | | | 361/118 |
| 2009/0207551 | A1 | 8/2009 | Suzuki | |
| 2010/0220427 | A1 | 9/2010 | Symes, Jr. | |
| 2011/0012960 | A1* | 1/2011 | Sakuma | ................. B41J 2/1404 |
| | | | | 347/44 |

FOREIGN PATENT DOCUMENTS

| | | |
|---|---|---|
| JP | 2009-215111 A | 9/2009 |
| JP | 2010-120835 A | 6/2010 |
| JP | 2012195577 A | 10/2012 |
| WO | 2012/070667 A1 | 5/2012 |
| WO | 2012093646 A1 | 7/2012 |
| WO | 2013/005701 A1 | 1/2013 |
| WO | 2013005700 A1 | 1/2013 |
| WO | 2013005701 A1 | 1/2013 |
| WO | 2013005702 A1 | 1/2013 |

OTHER PUBLICATIONS

Man-Soon Yoon, et al.; Science Direct; Effects of A-site Ca and B-site Zr substitution on dielectric properties and microstructure in tin-doped BaTiO3-CaTiO3 composites; Apr. 20 2007 received; available online Aug. 10, 2007; Chungiu National University, Chungbuk 380-702, Republic of Korea.

T.Karaki, et al.; Modified BaTiO3 Piezoelectric Ceramics with Bi2O3-Li2O Additive; Department of Intelligent Systems Design Engineering, Toyama Prefectural University, Imizu, Toyama 939-0398, Japan.

* cited by examiner

IN-PHASE

REVERSE-PHASE

PIEZOELECTRIC MATERIAL, PIEZOELECTRIC ELEMENT, AND ELECTRONIC APPARATUS

BACKGROUND OF THE INVENTION

Field of the Invention

The present invention relates to a piezoelectric material, in particular, a lead-free piezoelectric material. The present invention also relates to a piezoelectric element, a multilayered piezoelectric element, a liquid discharge head, a liquid discharge device, an ultrasonic motor, an optical apparatus, a vibratory device, a dust removing device, an image pickup device, and an electronic apparatus including the piezoelectric material.

Description of the Related Art

Piezoelectric materials are generally $ABO_3$ perovskite-type metal oxides such as lead zirconate titanate (hereinafter referred to as "PZT"). However, since PZT contains lead as an A site element, its influence on environment is controversial. Accordingly, there is a demand for a piezoelectric material of a lead-free perovskite-type metal oxide.

Barium titanate is known as a piezoelectric material of a lead-free perovskite-type metal oxide. In addition, in order to improve the characteristics, a material of which base composition is barium titanate has been developed.

Japanese Patent Laid-Open No. 2009-215111 discloses a piezoelectric material having an improved piezoelectric constant at room temperature of barium titanate by replacing a part of the A site of barium titanate with Ca and a part of the B site with Zr. Japanese Patent Laid-Open No. 2010-120835 discloses a piezoelectric material having an improved mechanical quality factor at room temperature of barium titanate by adding Mn, Fe, or Cu to a material obtained by replacing a part of the A site of barium titanate with Ca.

However, piezoelectric materials of known technology have problems that the piezoelectric constant is low in a high temperature region of a device driving temperature range (−30° C. to 50° C.), whereas the mechanical quality factor is low in a low temperature region. The present invention has been made in order to solve the above-mentioned problems and provides a lead-free piezoelectric material having satisfactory piezoelectric constant and mechanical quality factor in a device driving temperature range.

The present invention also provides a piezoelectric element, a multilayered piezoelectric element, a liquid discharge device, an ultrasonic motor, an optical apparatus, a vibratory device, a dust removing device, an image pickup device, and an electronic apparatus including the piezoelectric material.

SUMMARY OF THE INVENTION

The piezoelectric material according to the present invention includes a main component containing a perovskite-type metal oxide represented by Formula 1, a first auxiliary component composed of Mn, and a second auxiliary component composed of Bi or Bi and Li, wherein the content of Mn is 0.040 parts by weight or more and 0.500 parts by weight or less based on 100 parts by weight of the metal oxide on a metal basis; and the content of Bi is 0.042 parts by weight or more and 0.850 parts by weight or less and the content of Li is 0.028 parts by weight or less (including 0 parts by weight) based on 100 parts by weight of the metal oxide on a metal basis.

$(Ba_{1-x}Ca_x)_a(Ti_{1-y}Zr_y)O_3 \ldots$ (1), (wherein, $0.030 \le x \le 0.090$, $0.030 \le y \le 0.080$, and $0.9860 \le a \le 1.0200$).

The piezoelectric element according to the present invention at least includes a first electrode, a piezoelectric material part, and a second electrode. The piezoelectric material constituting the piezoelectric material part is the piezoelectric material of the present invention.

The multilayered piezoelectric element according to the present invention is composed of alternately laminated piezoelectric material layers and electrode layers each including an internal electrode. The piezoelectric material layers are made of the piezoelectric material of the present invention.

The liquid discharge head according to the present invention at least includes a liquid chamber including a vibrating unit including the piezoelectric element or the multilayered piezoelectric element of the present invention and a discharge port communicating with the liquid chamber.

The liquid discharge device according to the present invention includes a conveying unit for conveying a recording medium and the liquid discharge head of the present invention.

The ultrasonic motor according to the present invention at least includes a vibratory body including the piezoelectric element or the multilayered piezoelectric element of the present invention and a moving body being in contact with the vibratory body.

The optical apparatus according to the present invention includes the ultrasonic motor of the present invention in the driving unit.

The vibratory device according to the present invention includes a vibratory body including a diaphragm provided with the piezoelectric element or the multilayered piezoelectric element of the present invention.

The dust removing device according to the present invention includes a vibrating unit provided with the vibratory device of the present invention.

The image pickup device according to the present invention at least includes the dust removing device of the present invention and an image pickup element unit. The diaphragm of the dust removing device is disposed on the light-receiving surface side of the image pickup element unit.

The electronic apparatus of the present invention includes a piezoelectric acoustic component including the piezoelectric element or the multilayered piezoelectric element of the present invention.

Further features of the present invention will become apparent from the following description of exemplary embodiments with reference to the attached drawings.

The present invention can provide a lead-free piezoelectric material having satisfactory piezoelectric constant and mechanical quality factor in a device driving temperature range (−30° C. to 50° C.) The invention can provide a piezoelectric material having a particularly excellent mechanical quality factor.

The present invention can also provide a piezoelectric element, a multilayered piezoelectric element, a liquid discharge head, a liquid discharge device, an ultrasonic motor, an optical apparatus, a vibratory device, a dust removing device, an image pickup device, and an electronic apparatus including the piezoelectric material.

DESCRIPTION OF THE EMBODIMENTS

Figure 1:
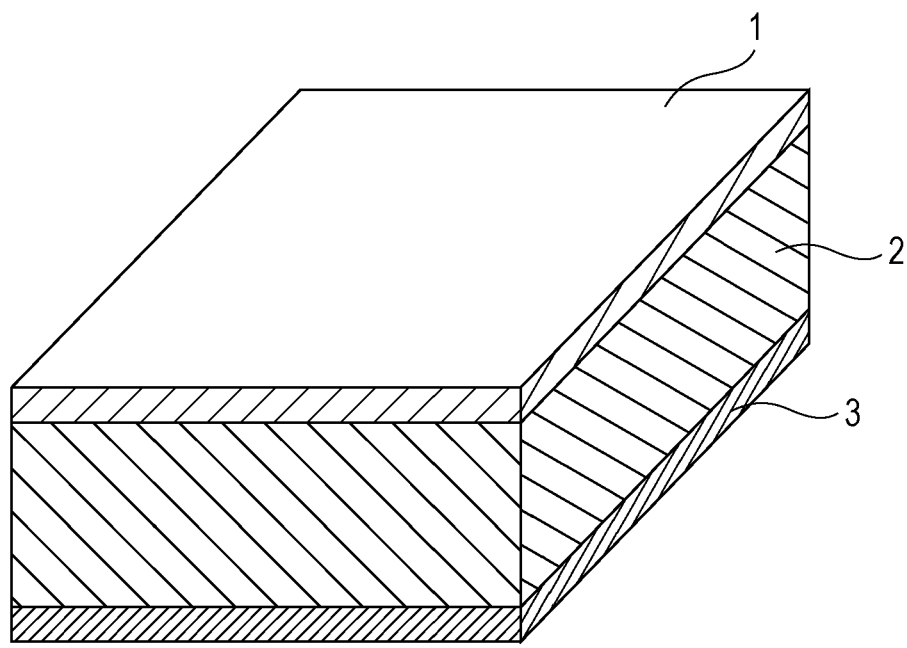
FIG. 1 is a schematic diagram illustrating an embodiment of the configuration of a piezoelectric element of the present invention.

Embodiments of the present invention will now be described.

The piezoelectric material according to the present invention includes a main component containing a perovskite-type metal oxide represented by Formula 1, a first auxiliary component composed of Mn, and a second auxiliary component composed of Bi or Bi and Li, wherein the content of Mn is 0.040 parts by weight or more and 0.500 parts by weight or less based on 100 parts by weight of the metal oxide on a metal basis; and the content of Bi is 0.042 parts by weight or more and 0.850 parts by weight or less and the content of Li is 0.028 parts by weight or less (including 0 parts by weight) based on 100 parts by weight of the metal oxide on a metal basis.

$(Ba_{1-x}Ca_x)_a(Ti_{1-y}Zr_y)O_3$ . . . (1), (wherein, $0.030 \leq x < 0.090$, $0.030 \leq y \leq 0.080$, and $0.9860 \leq a \leq 1.0200$).

(Perovskite-Type Metal Oxide)

In the present invention, the perovskite-type metal oxide refers to a metal oxide having a perovskite structure, which is ideally a cubic crystal structure, as described in Iwanami Dictionary of Physics and Chemistry, 5th Edition (Iwanami Shoten, Published on Feb. 20, 1998). A metal oxide having a perovskite structure is generally expressed by a chemical formula: $ABO_3$. In the perovskite-type metal oxide, elements A and B occupy specific unit cell positions called A site and B site, respectively, in the ion forms. For example, in a cubic crystal unit cell, the element A is placed at the vertexes of the cubic, and the element B is placed at the body-centered position of the cubic. The element O occupies the face-centered positions as anions of oxygen.

In the metal oxide represented by Formula 1, the metal elements positioned at the A site are Ba and Ca, and the metal elements positioned at the B site are Ti and Zr. However, a part of Ba and Ca atoms may be positioned at the B site. Similarly, a part of Ti and Zr atoms may be positioned at the A site.

The molar ratio of the elements on the B site to the element O in Formula 1 is basically 1:3, but the molar ratio may slightly shift as long as the perovskite structure is the primary phase of the metal oxide. Such a case is encompassed in the scope of the present invention.

The perovskite structure of the metal oxide can be confirmed by structural analysis, such as X-ray diffraction or electron beam diffraction.

(Main Component of Piezoelectric Material)

In the piezoelectric material of the present invention, "a" represents the ratio of the molar quantity of Ba and Ca at the A site to the molar quantity of Ti and Zr at the B site in Formula 1 is in the range of $0.9860 \leq a \leq 1.0200$. If the value of "a" is smaller than 0.9860, the crystal grains constituting the piezoelectric material tend to abnormally grow to reduce the mechanical strength of the material. In contrast, if the value of "a" is larger than 1.0200, the temperature necessary for grain growth is too high, which makes sintering in a common firing furnace impossible. Herein, "sintering is impossible" indicates that a sufficient density is not obtained or that a large number of pores or defects are formed in the piezoelectric material.

In Formula 1, "y" representing the molar ratio of Zr at the B site is in the range of $0.030 \leq y \leq 0.080$. A value of "y" larger than 0.080 decreases the Curie temperature to give insufficient high-temperature durability, and a value of "y" smaller than 0.030 provides insufficient piezoelectric properties within the device driving temperature range.

In Formula 1, "x" representing the molar ratio of Ca at the A site is in the range of $0.030 \leq x < 0.090$. A value of "x" not less than 0.090 provides insufficient piezoelectric properties within the device driving temperature range, and a value of "x" smaller than 0.030 provides an insufficient mechanical quality factor within the device driving temperature range.

Throughout the specification, the term "Curie temperature (Tc)" refers to the temperature at which the ferroelectricity of a material is lost. In general, the piezoelectric properties of a piezoelectric material are also lost at a temperature of the Tc or more. The Tc can be determined by directly measuring the temperature at which the ferroelectricity is lost while changing the temperature or can be determined from the temperature showing a maximum relative dielectric constant determined by measuring the relative dielectric constants using a small AC electric field while changing the temperature.

The composition of the piezoelectric material according to the present invention may be measured by any method. Examples of the method include X-ray fluorescence analysis, ICP emission spectrometric analysis, and atomic absorption spectrometry. Any of these methods can calculate the weight ratio and the composition ratio of each element contained in the piezoelectric material.

(First Auxiliary Component of Piezoelectric Material)

The first auxiliary component is composed of Mn. The content of Mn is 0.040 parts by weight or more and 0.500 parts by weight or less based on 100 parts by weight of the perovskite-type metal oxide on a metal basis.

Herein, the content "on a metal basis" of an auxiliary component is denoted by a ratio of the weight of the auxiliary component to the total weight, which is assumed to be 100, of a metal oxide determined by measuring the piezoelectric material by, for example, X-ray fluorescence analysis (XRF), ICP emission spectrometric analysis, or atomic absorption spectrometry and converting each element constituting the metal oxide represented by Formula 1 to the oxide of the element from the measured content of each metal.

The piezoelectric material of the present invention containing Mn in the above-mentioned range can have an improved mechanical quality factor without deteriorating the piezoelectric constant in the whole device driving temperature range. Herein, the mechanical quality factor represents the elastic loss resulting from vibration when a piezoelectric material is evaluated as an oscillator. The value of the mechanical quality factor is observed as the sharpness of a resonance curve in impedance measurement. That is, the mechanical quality factor represents the sharpness of resonance of an oscillator. A higher mechanical quality factor means less loss of energy by vibration. A high insulation property and a high mechanical quality factor ensure long-term reliability of a piezoelectric element including the piezoelectric material when the piezoelectric element is driven by application of a voltage.

If the content of Mn is less than 0.040 parts by weight, the mechanical quality factor is reduced to less than 400 at a temperature within the device driving temperature range. A low mechanical quality factor increases the electricity consumption for driving a piezoelectric element including the piezoelectric material and a pair of electrodes as a resonance device. The mechanical quality factor is preferably 400 or more, more preferably 500 or more, and most preferably 600 or more. In this range, no significant increase in electricity consumption occurs in practical driving of a device. In contrast, a Mn content of higher than 0.500 parts by weight decreases the insulation property of the piezoelectric material. For example, the piezoelectric material may have a dielectric loss of higher than 0.006 at a frequency of 1 kHz or a resistivity of less than 1 G$\Omega$·cm. The dielectric loss can be measured with an impedance analyzer. A dielectric loss of 0.006 or less allows stable behavior even in a case of using a piezoelectric material as an element and applying a high voltage to the element. A piezoelectric material having a resistivity of at least 1 G$\Omega$·cm can polarize and can be driven as a piezoelectric element. The resistivity is more preferably 50 G$\Omega$·cm or more.

Mn can be present at the B site only. The valence of Mn can be 4+. In general, the valence of Mn can be 4+, 2+, or 3+. When a crystal contains a conduction electron (e.g., a case of a crystal having an oxygen defect or a case of the A site occupied by a donor element), a reduction in the valence of Mn from 4+ to 3+ or to 2+ traps the conduction electron to enhance the insulation resistance. In addition, from the viewpoint of ionic radius, Mn having a valence of 4+ can easily replace Ti, which is the main component of the B site.

In contrast, when the valence of Mn is lower than 4+, such as 2+, Mn serves as an acceptor. If Mn is present in a perovskite structure crystal as an acceptor, a hole is generated in the crystal, or oxygen vacancy is formed in the crystal.

If the majority of Mn atoms have a valence of 2+ or 3+, the holes are not completely compensated by merely introducing oxygen vacancy, resulting in a reduction in insulation resistance. Accordingly, the majority of Mn atoms should have a valence of 4+. However, a significantly small amount of Mn atoms having a valence of lower than 4+ may be present as an acceptor at the B site of the perovskite structure and may form oxygen vacancy. The Mn having a valence of 2+ or 3+ and the oxygen vacancy form a defect dipole and can enhance the mechanical quality factor of the piezoelectric material.

(Second Auxiliary Component of Piezoelectric Material)

The second auxiliary component is composed of Bi or Bi and Li. The content of Bi is 0.042 parts by weight or more and 0.850 parts by weight or less and the content of Li is 0.028 parts by weight or less (including 0 parts by weight) based on 100 parts by weight of the metal oxide on a metal basis.

The piezoelectric material of the present invention containing Bi or Bi and Li within the above-mentioned ranges can have a highly improved mechanical quality factor without deteriorating the piezoelectric constant, in particular, at low temperature. It is believed that the majority of trivalent Bi atoms are positioned at the A site and a part of the Bi atoms are positioned at the B site or at crystal grain boundaries. Bi positioned at the A site can provide a sufficient mechanical quality factor even if the crystal has an orthorhombic crystal structure. Bi positioned at the B site has a valence different from the valence (mainly tetravalent) of Ti or Zr when the crystal has a tetragonal crystal structure. Consequently, a defect dipole is introduced to allow generation of an internal electric field. Accordingly, a sufficient mechanical quality factor can be obtained in both the orthorhombic and tetragonal crystal structures. That is, the piezoelectric material of the present invention contains an appropriate amount of Bi and thereby can have a sufficient mechanical quality factor within the device driving temperature range. A Bi content of less than 0.042 parts by weight gives a mechanical quality factor of less than 400 at low temperature (e.g., −30° C.) and is therefore undesirable.

In contrast, a Bi content of higher than 0.850 parts by weight gives insufficient piezoelectric properties and is therefore undesirable. From the viewpoint of achieving higher mechanical quality factor and piezoelectric constant within the device driving temperature range (−30° C. to 50° C.), the content of Bi is more preferably 0.100 parts by weight or more and 0.850 parts by weight or less and most preferably 0.100 parts by weight or more and 0.480 parts by weight or less. A Li content of higher than 0.028 parts by weight gives insufficient piezoelectric properties and is therefore undesirable. When the content of Li is 0.028 parts by weight or less, the piezoelectric properties are not deteriorated, and sintering can be performed at a lower temperature than the case of not containing Li.

Bi is not limited to metal Bi, and the form of Bi may be any form as long as a Bi component is contained in the piezoelectric material. For example, Bi may be solid-soluted in the A site or the B site or may be contained in the crystal grain boundaries (hereinafter, referred to as grain boundaries). The Bi component may be contained in the piezoelectric material in a form such as a metal, an ion, an oxide, a metal salt, or a complex.

Li is not limited to metal Li, and the form of Li may be any form as long as a Li component is contained in the piezoelectric material. For example, Li may be solid-soluted in the A site or the B site or may be contained in the grain boundaries. The Li component may be contained in the piezoelectric material in a form such as a metal, an ion, an oxide, a metal salt, or a complex.

(Third Auxiliary Component of Piezoelectric Material)

The piezoelectric material according to the present invention can contain a third auxiliary component composed of Mg, and the content of the third auxiliary component is preferably 0.10 parts by weight or less (excluding 0 parts by weight) based on 100 parts by weight of the perovskite-type metal oxide represented by Formula 1 on a metal basis. The piezoelectric material containing Mg within the above-mentioned range can improve the mechanical quality factor.

If the content of Mg is larger than 0.10 parts by weight, the mechanical quality factor is reduced to less than 400 at some temperature within the device driving temperature range. A low mechanical quality factor increases the electricity consumption for driving a piezoelectric element including the piezoelectric material and a pair of electrodes as a resonance device. The mechanical quality factor is more preferably 500 or more and most preferably 600 or more. From the viewpoint of achieving a higher mechanical quality factor, the content of Mg is preferably 0.05 parts by weight or less.

The form of Mg is not limited to a metal Mg as long as an Mg component is contained in the piezoelectric material. For example, Mg may be solid-soluted in the A site or the B site or may be contained in the grain boundaries. The Mg component may be contained in the piezoelectric material in a form such as a metal, an ion, an oxide, a metal salt, or a complex.

(Fourth Auxiliary Component of Piezoelectric Material)

The piezoelectric material according to the present invention can contain a fourth auxiliary component containing at least one of Si and B, and the content of the fourth auxiliary component is preferably 0.001 parts by weight or more and 4.000 parts by weight or less, more preferably 0.003 parts by weight or more and 2.000 parts by weight or less, based on 100 parts by weight of the perovskite-type metal oxide represented by Formula 1 on a metal basis.

The fourth auxiliary component contains at least one of Si and B. B and Si segregate at grain boundaries of the piezoelectric material. Consequently, the leakage current flowing in the grain boundaries is decreased to increase the resistivity. A piezoelectric material containing the fourth auxiliary component in a content of 0.001 parts by weight or more has a high resistivity to improve the insulation property. A piezoelectric material containing the fourth auxiliary component in a content of not less than 4.000 parts by weight decreases the dielectric constant, resulting in a decrease of the piezoelectric properties, and is therefore undesirable. The content of Si is more preferably 0.003 parts by weight or more and 1.000 part by weight or less based on 100 parts by weight of the perovskite-type metal oxide. The content of B is more preferably 0.001 parts by weight or more and 1.000 parts by weight or less.

In the multilayered piezoelectric element, the piezoelectric material disposed between electrodes is thin and is therefore required to have durability against a high electric field. The piezoelectric material according to the present invention has particularly excellent insulation properties and, therefore, can be suitably applied to such a multilayered piezoelectric element.

The piezoelectric material according to the present invention may contain Nb in an amount comparable to that contained in a commercially available Ti raw material as an inevitable component and Hf in an amount comparable to that contained in a commercially available Zr raw material as an inevitable component.

The piezoelectric material according to the present invention can contain the perovskite-type metal oxide represented by Formula 1, the first auxiliary component, the second auxiliary component, the third auxiliary component, and the fourth auxiliary component such that the sum total thereof is 98.5 mol % or more. The piezoelectric material can contain the perovskite-type metal oxide represented by Formula 1 as the main component in an amount of 90 mol % or more, more preferably 95 mol % or more.

(Grain Diameter and Equivalent Circle Diameter of Crystal Grains)

In the piezoelectric material according to the present invention, the crystal grains constituting the piezoelectric material can have an average equivalent circular diameter of 0.5 µm or more and 10 µm or less. The average equivalent circular diameter refers to the mean value of equivalent circle diameters of a plurality of crystal grains. When the average equivalent circular diameter of crystal grains is in this range, the piezoelectric material of the present invention can have satisfactory piezoelectric properties and mechanical strength. An average equivalent circular diameter of less than 0.5 µm may provide insufficient piezoelectric properties, whereas an average equivalent circular diameter of larger than 10 µm may decrease the mechanical strength. The average equivalent circular diameter can be in a range of 0.5 µm or more and 4.5 µm or less.

In the present invention, the term "equivalent circle diameter" represents "equivalent circular area diameter" usually used in microscopic observation and represents the diameter of a perfect circle having the same area as that of the projected area of a crystal grain. In the present invention, the equivalent circle diameter may be measured by any method. For example, the equivalent circle diameter can be determined by image processing of a photographic image of the piezoelectric material surface photographed with a polarizing microscope or a scanning electron microscope. Since the optimum magnification varies depending on the grain diameter of an object, an optical microscope or an electron microscope may be used properly depending on the diameter. The equivalent circle diameter may be determined from an image of a polished surface or a cross section instead of the surface of a material.

(Relative Density)

The piezoelectric material of the present invention can have a relative density of 93% or more and 100% or less.

The relative density is the ratio of the actually measured density to the theoretical density calculated from the lattice constant of the piezoelectric material and the atomic weight of the constituent elements of the piezoelectric material. The lattice constant can be measured by, for example, X-ray diffraction analysis. The density can be measured by, for example, an Archimedes's method.

A relative density of less than 93% may provide insufficient piezoelectric properties and mechanical quality factor or may reduce the mechanical strength.

The piezoelectric material of the present invention can have a relative density of 95% or more and 100% or less and more preferably 97% or more and 100% or less.

(Method of Producing Piezoelectric Material)

The piezoelectric material according to the present invention may be produced by any method. A typical method will now be described.

(Raw Materials for Piezoelectric Material)

A piezoelectric material can be produced by a usual method by forming a green compact from solid powders of, for example, oxides, carbonates, nitrates, or oxalates containing constituent elements and sintering the green compact under a normal pressure. The raw material is constituted of a metal compound such as Ba compound, Ca compound, Ti compound, Zr compound, Mn compound, Bi compound, Li compound, Mg compound, B compound and Si compound.

Usable examples of the Ba compound include barium oxide, barium carbonate, barium oxalate, barium acetate, barium nitrate, barium titanate, barium zirconate, barium zirconate titanate, and barium titanate zirconate. As these Ba compounds, commercially available high-purity compounds (e.g., a purity of 99.99% or more) may be used.

Usable examples of the Ca compound include calcium oxide, calcium carbonate, calcium oxalate, calcium acetate, calcium titanate, calcium zirconate, and calcium titanate. As these Ca compounds, commercially available high-purity compounds (e.g., a purity of 99.99% or more) may be used.

Usable examples of the Ti compound include titanium oxide, barium titanate, barium zirconate titanate, and calcium titanate. When these Ti compounds contain alkali earth metals such as barium and calcium, commercially available high-purity compounds (e.g., a purity of 99.99% or more) may be used.

Usable examples of the Zr compound include zirconium oxide, barium zirconate, barium zirconate titanate, and calcium zirconate. When these Zr compounds contain alkali earth metals such as barium and calcium, commercially available high-purity compounds (e.g., a purity of 99.99% or more) may be used.

Usable examples of the Mn compound include manganese carbonate, manganese oxide, manganese dioxide, manganese acetate, and trimanganese tetraoxide.

Usable examples of the Bi compound include bismuth oxide and lithium bismuthate.

Usable examples of the Li compound include lithium carbonate and lithium bismuthate.

Usable examples of the Mg compound include magnesium carbonate, magnesium oxide, magnesium hydroxide, magnesium peroxide, and magnesium chloride.

Usable examples of the Si compound include silicon dioxide.

Usable examples of the B compound include boron oxide.

In the piezoelectric material according to the present invention, the "a" showing the ratio of the molar quantity of Ba and Ca at the A site to the molar quantity of Ti and Zr at the B site may be adjusted with any raw material. The same effect can be obtained by adjusting the "a" with any of Ba compounds, Ca compounds, Ti compounds, and Zr compounds.

(Granulated Powder and Green Compact)

The green compact is a solid prepared by molding the solid powder. Examples of the molding method include uniaxial pressing, cold hydrostatic pressing, hot hydrostatic pressing, casting, and extrusion. The green compact may be produced from a granulated powder. Sintering of the green compact formed from a granulated powder has an advantage that the size distribution of the crystal grains of the sintered compact can be readily uniformized. From the viewpoint of enhancing the insulation properties of the sintered compact, the green compact can contain a fourth auxiliary component containing at least one of Si and B.

The raw material powder of the piezoelectric material may be granulated by any method. Spray drying can be employed from the viewpoint of providing a granulated powder with a more uniform grain diameter.

Examples of binders that can be used in granulation include polyvinyl alcohol (PVA), polyvinyl butylal (PVB), and acrylic resins. The amount of the binder to be used in granulation is preferably 1 to 10 parts by weight based on 100 parts by weight of the raw material powder for the piezoelectric material and more preferably 2 to 5 parts by weight from the viewpoint of increasing the density of the green compact.

(Sintering)

The green compact may be sintered by any method.

Examples of the sintering include sintering in an electric furnace, sintering in a gas furnace, electrical heating, microwave sintering, millimeter-wave sintering, and hot isostatic pressing (HIP). The electric furnace and the gas furnace may be continuous furnaces or batch furnaces.

The sintering may be performed at any temperature, and a temperature allowing each compound to react and being sufficient for crystal growth may be employed. From the viewpoint of controlling the grain diameter within the range of 0.5 to 10 µm, the sintering temperature is preferably 1100° C. or more and 1400° C. or less and more preferably 1100° C. or more and 1350° C. or less. The piezoelectric material sintered in such a temperature range shows satisfactory piezoelectric performance. In order to stably reproduce the properties of a piezoelectric material prepared by sintering, the sintering is performed at a constant temperature within the above-mentioned range for 2 to 48 hours. Though sintering such as two-stage sintering may be employed, a method that does not involve a rapid temperature change can be employed in light of productivity.

The piezoelectric material prepared by sintering is polished and can then be heat-treated at a temperature of 1000° C. or more. Though the mechanical polishing generates a residual stress inside the piezoelectric material, the heat treatment at 1000° C. or more relieves the residual stress to further enhance the piezoelectric properties of the piezoelectric material. The heat treatment also has an effect of eliminating the raw material powder, such as barium carbonate, precipitated at the grain boundaries. The heat treatment may be performed for any period of time, for example, 1 hour or more.

(Piezoelectric Element)

FIG. 1 is a schematic diagram illustrating an embodiment of the configuration of a piezoelectric element of the present invention. The piezoelectric element according to the present invention at least includes a first electrode 1, a piezoelectric material part 2, and a second electrode 3. The piezoelectric material constituting the piezoelectric material part 2 is the piezoelectric material of the present invention.

The piezoelectric material according to the present invention can be evaluated for the piezoelectric properties thereof by being produced into a piezoelectric element at least having a first electrode and a second electrode. The first and the second electrodes are each a conductive layer having a thickness of about 5 nm to 10 µm. Each electrode may be made of any material that is usually used in piezoelectric elements. Examples of the material include metals such as Ti, Pt, Ta, Ir, Sr, In, Sn, Au, Al, Fe, Cr, Ni, Pd, Ag, and Cu; and compounds thereof.

The first and the second electrodes may be each made of any of these materials or may be each a multilayer made of two or more of these materials. The first and the second electrodes may be made of different materials.

The first and the second electrodes may be produced by any method and may be formed by, for example, baking of a metal paste, sputtering, or vapor deposition. The first and the second electrodes may be each patterned into a desired shape.

(Polarization Treatment)

In the piezoelectric element, the polarization axes may be aligned in the same direction. The polarization axes aligned in the same direction increase the piezoelectric constant of the piezoelectric element.

The piezoelectric element may be polarized by any method. The polarization treatment may be performed in the atmosphere or in a silicone oil. The temperature for the polarization may be 60° C. to 150° C. The optimum conditions for the polarization slightly vary depending on the composition of the piezoelectric material constituting the element. The electric field applied for the polarization treatment may be from 800 V/mm to 2.0 kV/mm.

(Measurement of Piezoelectric Constant and Mechanical Quality Factor)

The piezoelectric constant and the mechanical quality factor of the piezoelectric element can be determined by calculation based on Electronic Materials Manufacturers Association Standard (JEITA EM-4501) from the resonance frequency and the antiresonance frequency measured with a commercially available impedance analyzer. This method is hereinafter referred to as a resonance-antiresonance method.

(Multilayered Piezoelectric Element)

The multilayered piezoelectric element of the present invention will now be described.

The multilayered piezoelectric element according to the present invention is composed of alternately laminated piezoelectric material layers and electrode layers each including an internal electrode. The piezoelectric material layers are made of the piezoelectric material of the present invention.

Figure 2A:
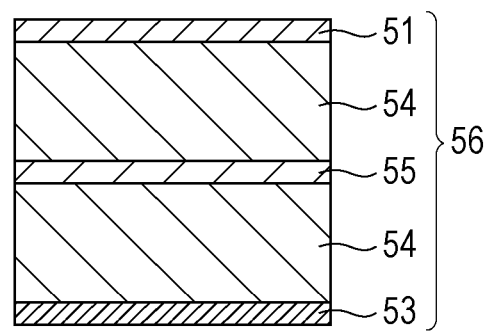
FIGS. 2A and 2B are schematic cross-sectional diagrams illustrating an embodiment of the configuration of a multi-layered piezoelectric element of the present invention.
Figure 2B:
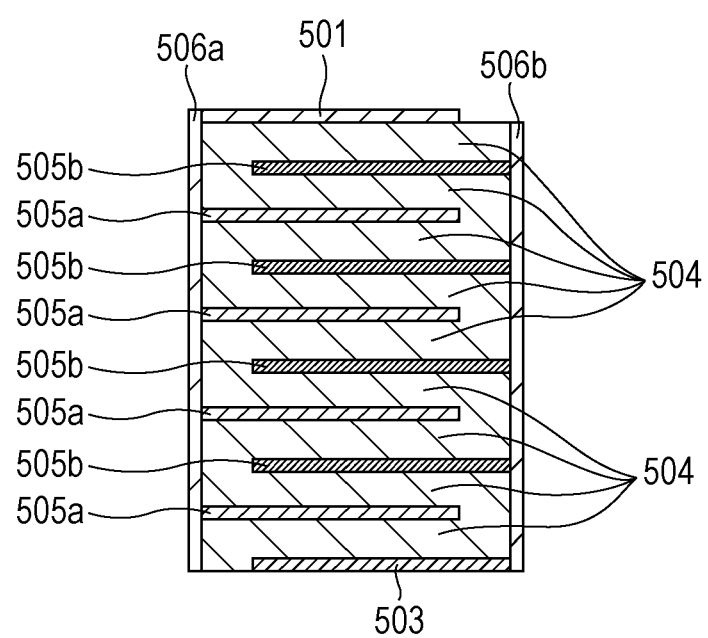

FIGS. 2A and 2B are schematic cross-sectional diagrams illustrating an embodiment of the configuration of a multi-layered piezoelectric element of the present invention. The multilayered piezoelectric element according to the present invention is constituted of piezoelectric material layers 54 and electrode layers including an internal electrode 55 that are alternately laminated. The piezoelectric material layers 54 are made of the piezoelectric material of the present invention. The electrodes may include external electrodes such as a first electrode 51 and a second electrode 53, in addition to the internal electrode 55.

FIG. 2A shows a configuration of a multilayered piezoelectric element of the present invention, where a laminate structure composed of two piezoelectric material layers 54 and one internal electrode 55 are alternately stacked is disposed between the first electrode 51 and the second electrode 53. The numbers of the piezoelectric material layers and the internal electrodes are not limited and may be increased as shown in FIG. 2B. The multilayered piezoelectric element shown in FIG. 2B includes a laminate structure composed of alternately laminated nine piezoelectric material layers 504 and eight internal electrodes 505 (505a or 505b) disposed between the first electrode 501 and the second electrode 503. The multilayered piezoelectric element includes an external electrode 506a and an external electrode 506b for short-circuiting the alternately disposed internal electrodes.

The sizes and the shapes of the internal electrodes 55, 505 and the external electrodes 506a, 506b are not necessarily the same as those of the piezoelectric material layers 54, 504 and may be divided into two or more pieces.

The internal electrodes 55, 505, the external electrodes 506a, 506b, the first electrodes 51, 501, and the second electrodes 53, 503 are each a conductive layer having a thickness of about 5 nm to 10 μm and may be made of any material that is usually used in piezoelectric elements. Examples of the material include metals such as Ti, Pt, Ta, Ir, Sr, In, Sn, Au, Al, Fe, Cr, Ni, Pd, Ag, and Cu; and compounds thereof. The internal electrodes 55, 505 and the external electrodes 506a, 506b may be each made of any one of these materials or a mixture or alloy of two or more of these materials or may be each a multilayer made of two or more of these materials. These electrodes may be made of different materials from one another.

The internal electrodes 55 and 505 each contain Ag and Pd such that the weight ratio M1/M2 of the content M1 of Ag to the content M2 of Pd is preferably 0.25 M1/M2 4.0 and more preferably 0.3 M1/M2 3.0. A weight ratio M1/M2 of less than 0.25 disadvantageously raises the sintering temperature of the internal electrode, whereas a weight ratio M1/M2 of higher than 4.0 undesirably forms an island-like internal electrode to make the surface uneven.

From the viewpoint of inexpensive electrode materials, the internal electrodes 55, 505 can contain at least one of Ni and Cu. In the case of the internal electrodes 55, 505 containing at least one of Ni and Cu, the multilayered piezoelectric element of the present invention can be fired in a reducing atmosphere.

As shown in FIG. 2B, a plurality of electrodes including the internal electrodes 505 may be short-circuited to each other for adjusting the phase of the driving voltage. For example, the internal electrodes 505a and the first electrode 501 may be short-circuited with the external electrode 506a. The internal electrodes 505b and the second electrode 503 may be short-circuited with the external electrode 506b. The internal electrodes 505a and the internal electrodes 505b may be alternately disposed. The form of short-circuit between electrodes is not particularly limited. An electrode or wiring for short-circuit may be disposed on the side surface of the multilayered piezoelectric element. Alternatively, electrodes may be short-circuited with a conductive material disposed inside a through-hole formed so as to pass through the piezoelectric material layers 504.

(Liquid Discharge Head)

The liquid discharge head of the present invention will now be described.

The liquid discharge head according to the present invention at least includes a liquid chamber provided with a vibrating unit including the piezoelectric element or the multilayered piezoelectric element and a discharge port communicating with the liquid chamber.

Figure 3A:
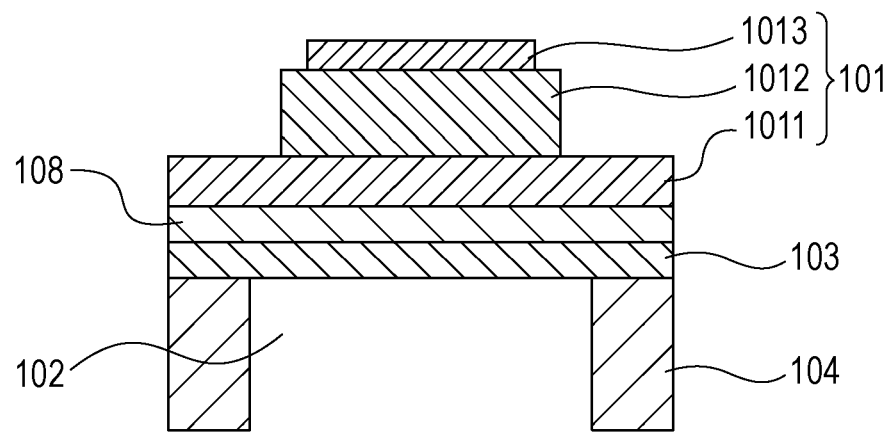
FIGS. 3A and 3B are schematic diagrams illustrating an embodiment of the configuration of a liquid discharge head of the present invention.
Figure 3B:
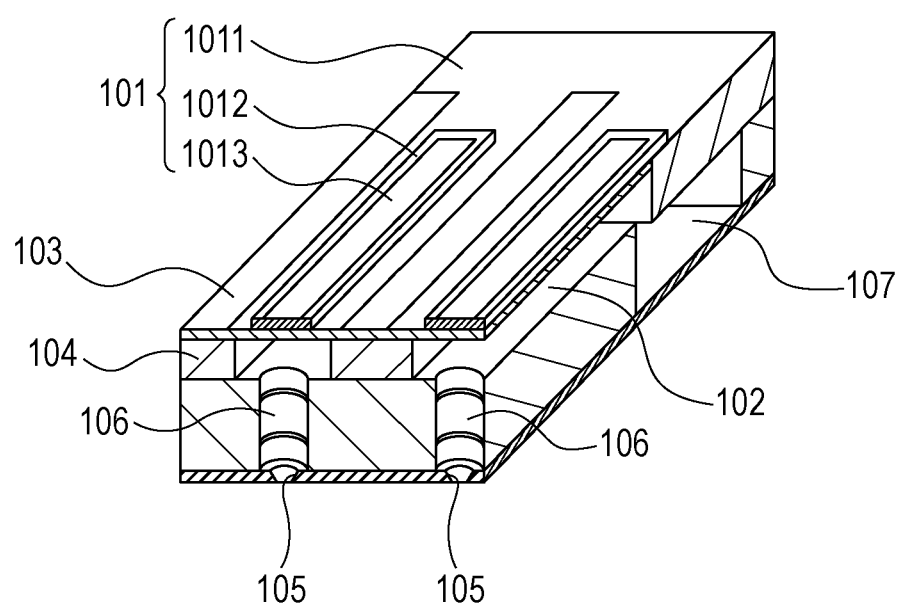

FIGS. 3A and 3B are schematic diagrams illustrating an embodiment of the configuration of a liquid discharge head of the present invention. As shown in FIGS. 3A and 3B, the liquid discharge head of the present invention includes a piezoelectric element 101 of the present invention. The piezoelectric element 101 at least includes a first electrode 1011, a piezoelectric material 1012, and a second electrode 1013. The piezoelectric material 1012 is optionally patterned as shown in FIG. 3B.

FIG. 3B is a schematic diagram of a liquid discharge head. The liquid discharge head includes discharge ports 105, individual liquid chambers 102, communication holes 106 connecting the individual liquid chambers 102 to the corresponding discharge ports 105, liquid chamber partitions 104, a common liquid chamber 107, diaphragms 103, and piezoelectric elements 101. The piezoelectric elements 101 shown in FIG. 3B each have a rectangular shape, but may have any shape such as an elliptical, circular, or parallelogram shape. In general, the piezoelectric material 1012 has a shape along the shape of the individual liquid chamber 102.

The vicinity of the piezoelectric element 101 in the liquid discharge head of the present invention will be described in detail with reference to FIG. 3A. FIG. 3A is a cross-sectional view in the width direction of the piezoelectric element shown in FIG. 3B. The cross section of the piezoelectric element 101 is rectangular, but may be trapezoidal or reverse trapezoidal.

In the drawing, the first electrode 1011 is used as a lower electrode, and the second electrode 1013 is used as an upper electrode. The arrangement of the first electrode 1011 and the second electrode 1013 is not limited to this. For example, the first electrode 1011 may be used as a lower electrode or an upper electrode. Likewise, the second electrode 1013 may be used as an upper electrode or a lower electrode. In addition, a buffer layer 108 may be disposed between the diaphragm 103 and the lower electrode. These differences in name are due to the difference in method of producing the devices, and the effects of the present invention can be achieved in any of these cases.

In the liquid discharge head, the diaphragm 103 vibrates up and down by the expansion and contraction of the piezoelectric material 1012 and applies a pressure to the liquid in the individual liquid chamber 102. As a result, the liquid is discharged from the discharge port 105. The liquid discharge head of the present invention can be used in printers or can be applied to production of electronic devices.

The diaphragm 103 can have a thickness of 1.0 μm or more and 15 μm less, preferably 1.5 μm more and 8 μm or less. The diaphragm may be made of any material. For example, the diaphragm may be made of Si, and Si of the diaphragm may be doped with boron or phosphorus. In addition, the buffer layer or the electrode layer on the diaphragm may be a part of the diaphragm. The buffer layer 108 may have a thickness of 5 nm or more and 300 nm or less, preferably 10 nm or more and 200 nm or less. The discharge port 105 has a size of 5 μm or more and 40 μm or less as the equivalent circle diameter. The shape of the discharge port 105 may be circular or a star, square, or triangle shape.

(Liquid Discharge Device)

The liquid discharge device of the present invention will now be described. The liquid discharge device of the present invention includes an object-holding portion and the liquid discharge head.

Figure 4:
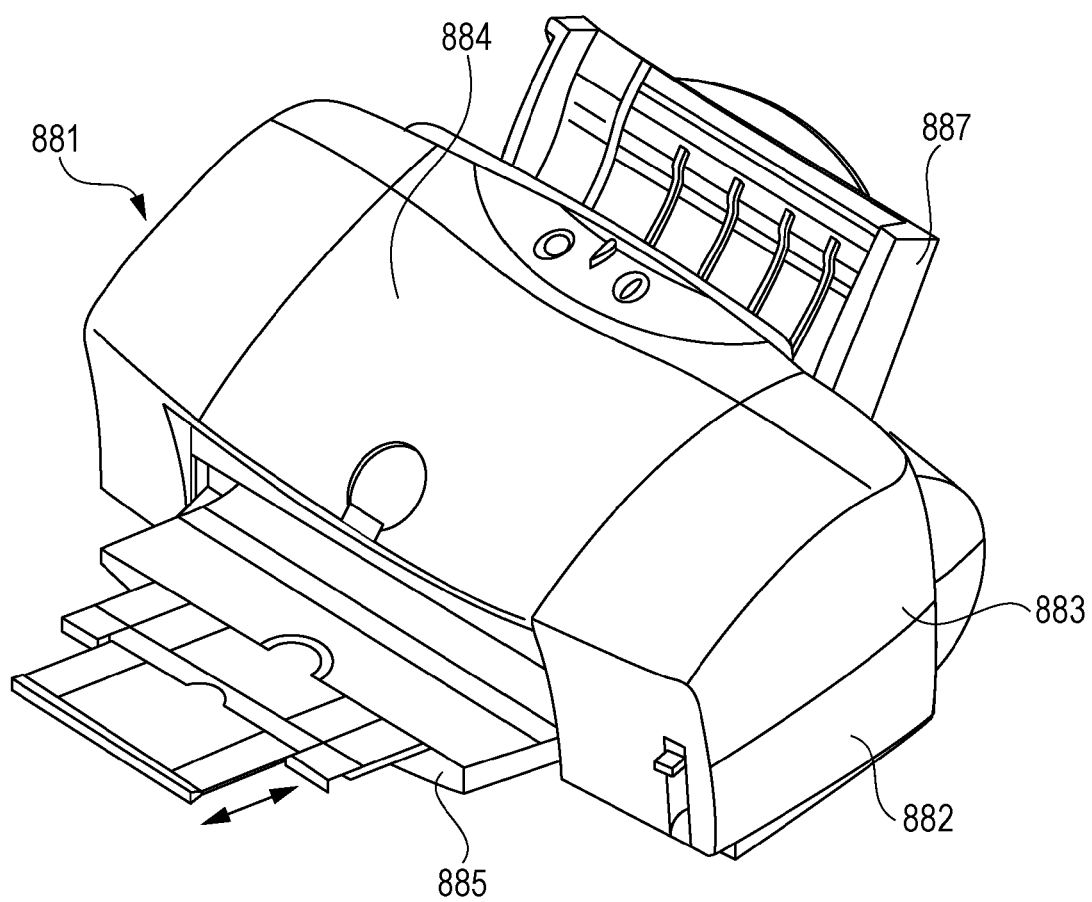
FIG. 4 is a schematic diagram illustrating an embodiment of a liquid discharge device of the present invention.
Figure 5:
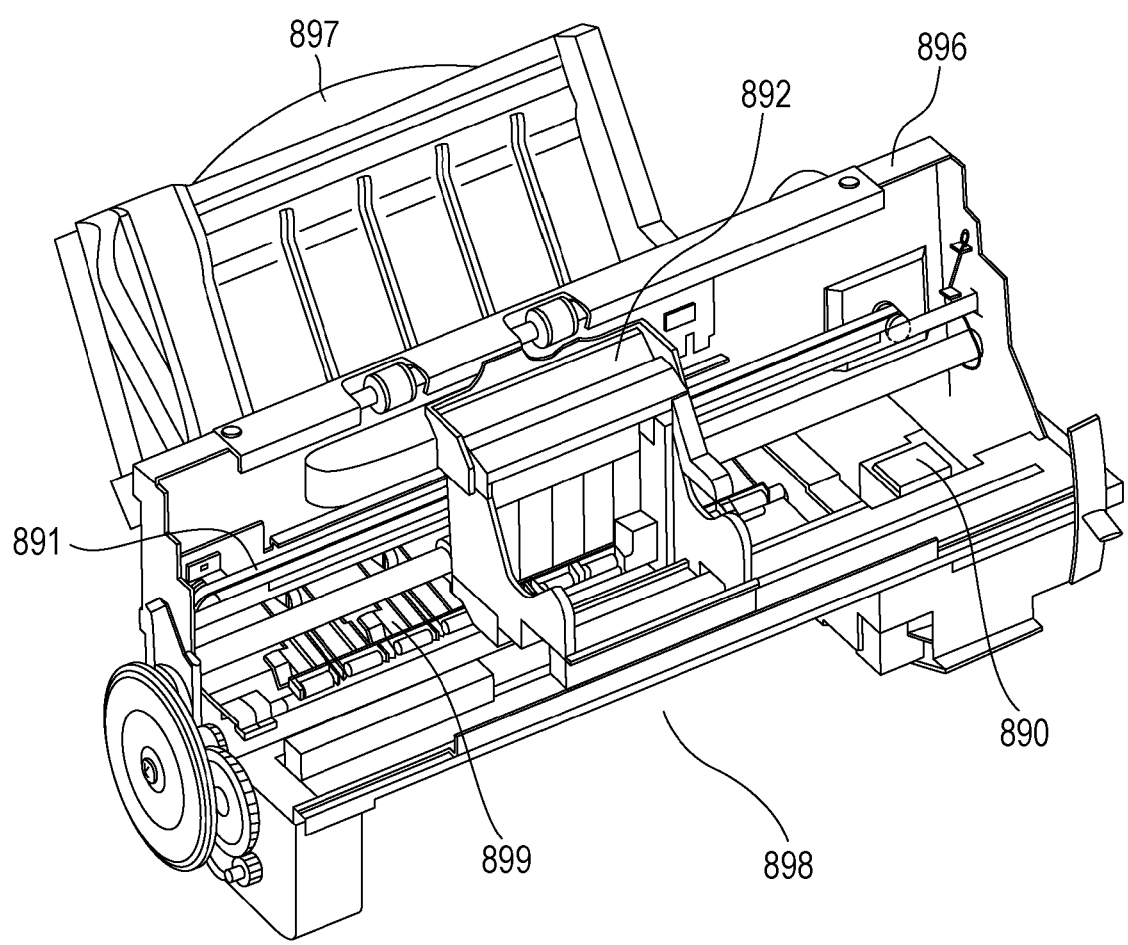
FIG. 5 is a schematic diagram illustrating an embodiment of a liquid discharge device of the present invention.

The ink-jet recording apparatus shown in FIGS. 4 and 5 is an example of the liquid discharge device of the present invention. FIG. 5 shows the liquid discharge device (ink-jet recording apparatus) 881 shown in FIG. 4 in a state where the exteriors 882 to 885 and 887 are removed. The ink-jet recording apparatus 881 includes an automatic feeder 897 for automatically feeding recoding paper as the object to the device main body 896. The ink-jet recording apparatus 881 further includes a conveying unit 899, which is the object-holding portion, for conveying the recording paper fed from the automatic feeder 897 to a predetermined recording position and then conveying the recording paper from the recording position to the ejection port 898; a recording portion 891 for performing recording onto the recording paper conveyed to the recording position; and a recovering portion 890 for performing recovering treatment to the recording portion 891. The recording portion 891 is provided with a carriage 892 that receives the liquid discharge head of the present invention and moves on a rail in a reciprocating motion.

In such an ink-jet recording apparatus, the carriage 892 slides on the rail according to the electric signals sent from a computer, and the piezoelectric material is displaced by application of a driving voltage to the electrodes between which the piezoelectric material is disposed. The displacement of the piezoelectric material applies a pressure to the individual liquid chamber 102 via the diaphragm 103 shown in FIG. 3B, and thereby an ink is discharged from the discharge port 105 to perform printing.

In the liquid discharge device of the present invention, it is possible to uniformly discharge a liquid at high speed and to reduce the size of the device.

The above-described example is a printer, but the liquid discharge device of the present invention can be used as not only printing apparatuses including ink-jet recording apparatuses, such as a facsimile machine, a multifunction machine, or a copier, but also as a liquid discharge device in industrial use and a drawing apparatuses for objects.

In addition, a user can select a desired object depending on the use. A configuration such that the liquid discharge head moves relatively to the object placed on a stage as the holding portion.

(Ultrasonic Motor)

The ultrasonic motor of the present invention will now be described. The ultrasonic motor according to the present invention at least includes a vibratory body including the piezoelectric element or the multilayered piezoelectric element and a moving body being in contact with the vibratory body.

Figure 6A:
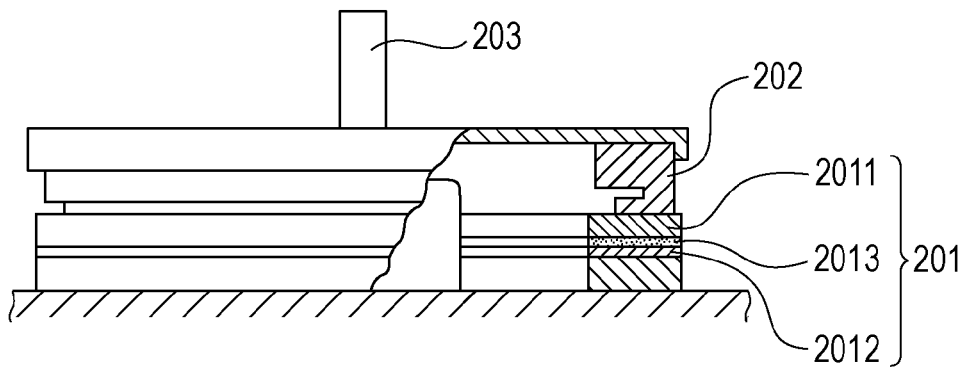
FIGS. 6A and 6B are schematic diagrams illustrating an embodiment of the configuration of an ultrasonic motor of the present invention.
Figure 6B:
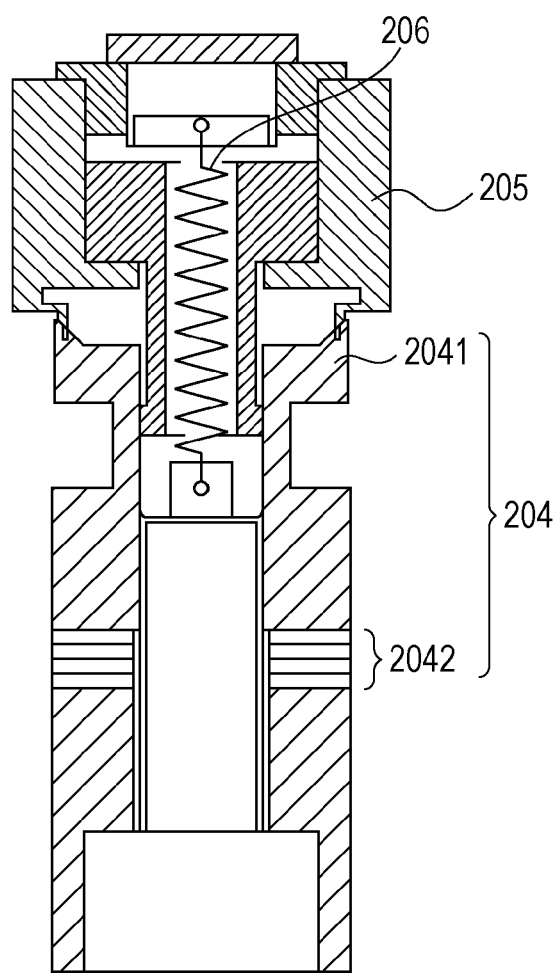

FIGS. 6A and 6B are schematic diagrams illustrating an embodiment of the configuration of an ultrasonic motor of the present invention. FIG. 6A shows an ultrasonic motor of which piezoelectric element of the present invention is a single plate. The ultrasonic motor includes an oscillator 201, a rotor 202 being in contact with the sliding surface of the oscillator 201 by means of a pressure applied by a spring (not shown), and an output shaft 203 disposed integrally with the rotor 202. The oscillator 201 is composed of a metal elastic ring 2011, a piezoelectric element 2012 of the present invention, and an organic adhesive (e.g., epoxy or cyanoacrylate adhesive) 2013 for bonding the piezoelectric element 2012 to the elastic ring 2011. The piezoelectric element 2012 of the present invention is constituted of a first electrode, a second electrode (both are not shown), and the piezoelectric material disposed therebetween.

When alternating voltage different in phase by odd number times π/2 is applied to the piezoelectric element of the present invention, bending travelling waves are generated in the oscillator 201, and each point on the sliding surface of the oscillator 201 moves in an elliptic motion. The rotor 202 pressed to the sliding surface of the oscillator 201 receives a frictional force from the oscillator 201 to rotate in the direction opposite to the bending travelling waves. The object (not shown) to be driven is connected to the output shaft 203 and is driven by the turning force of the rotor 202. A piezoelectric material to which a voltage applied expands and contracts by the transverse piezoelectric effect. When an elastic material such as a metal is in contact with the piezoelectric element, the elastic material is bent by the expansion and contraction of the piezoelectric material. The ultrasonic motor described here utilizes this principle.

FIG. 6B shows an example of an ultrasonic motor including a piezoelectric element having a laminate structure. The oscillator 204 is composed of a tubular metal elastic bodies 2041 and a multilayered piezoelectric element 2042 disposed between the elastic bodies. The multilayered piezoelectric element 2042 is constituted of a plurality of laminated (multilayered) piezoelectric materials (not shown) and includes first and second electrodes on the outer surfaces of the laminated piezoelectric materials and internal electrodes between the laminated piezoelectric materials. The metal elastic bodies 2041 are connected to each other with a bolt to fix the piezoelectric element 2042 therebetween to form the oscillator 204.

When alternating voltage different in phase is applied to the multilayered piezoelectric element 2042, the oscillator 204 generates two vibrations rectangular to each other. The two vibrations are combined to create a circular vibration for driving the end portion of the oscillator 204. The oscillator 204 is provided with a circumferential groove at the upper portion to enlarge the displacement of the vibration for driving. The rotor 205 is in pressurized contact with the oscillator 204 by means of the pressurizing spring 206 to create a frictional force for driving. The rotor 205 is rotatably supported by bearing.

(Optical Apparatus)

The optical apparatus of the present invention will now be described. The optical apparatus of the present invention includes the ultrasonic motor in its driving unit.

Figure 7A:
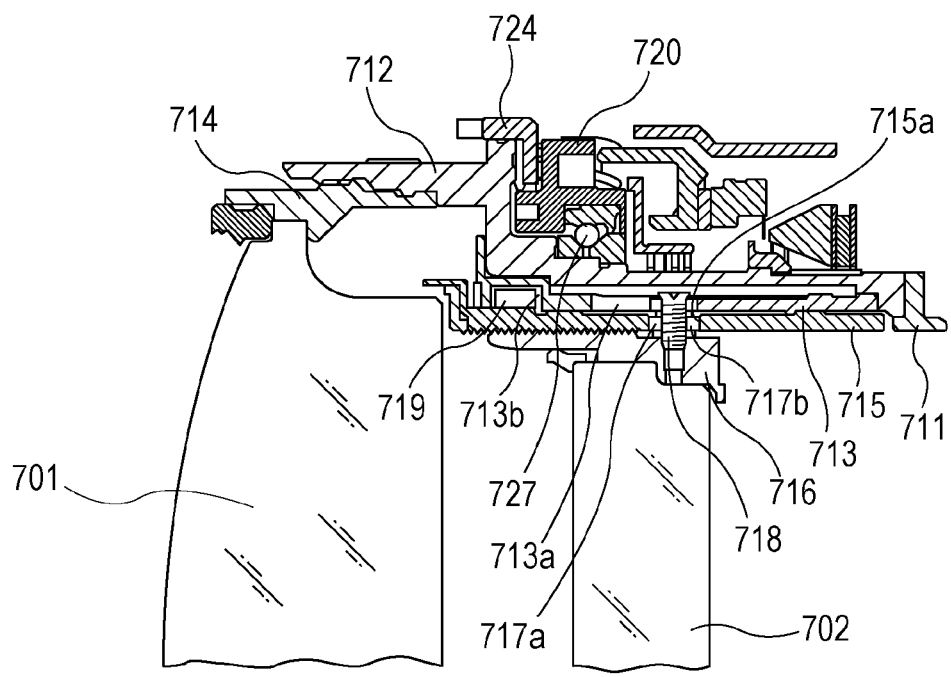
FIGS. 7A and 7B are schematic diagrams illustrating an embodiment of an optical apparatus of the present invention.
Figure 7B:
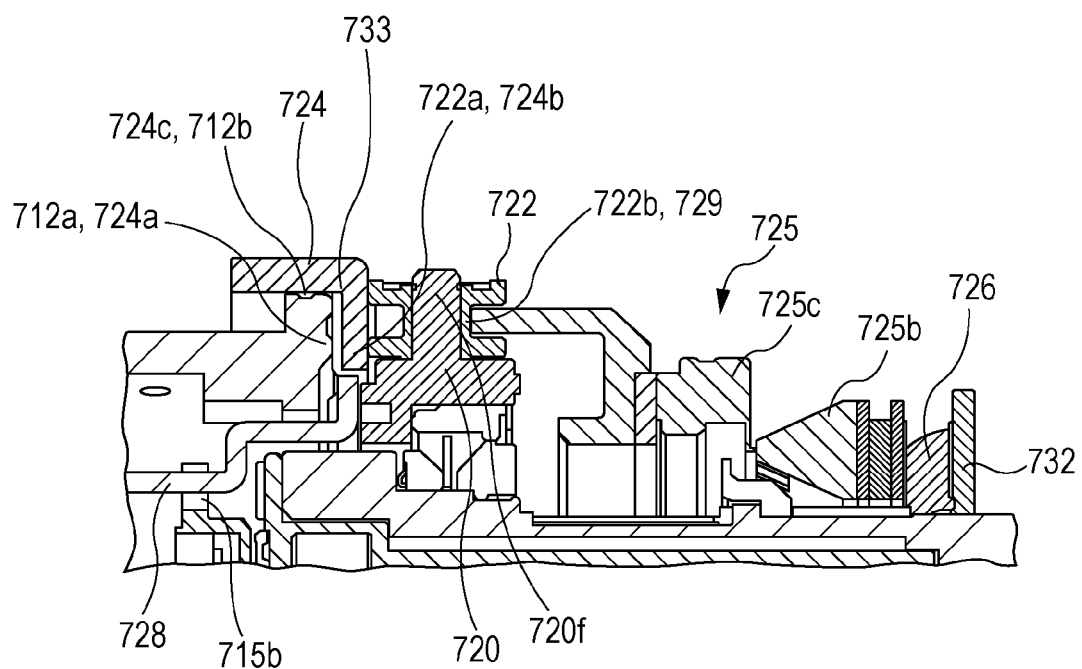
Figure 8:
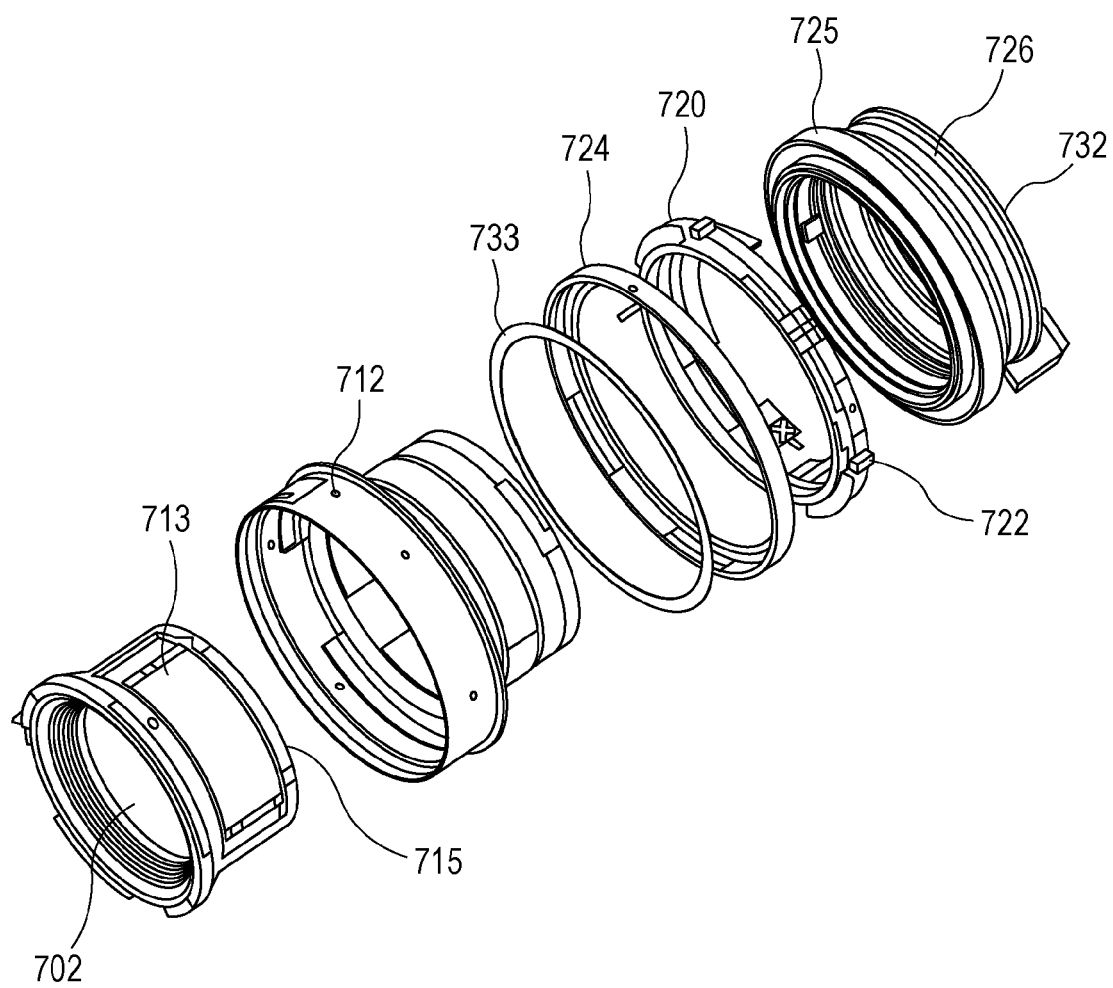
FIG. 8 is a schematic diagram illustrating an embodiment of an optical apparatus of the present invention.

FIGS. 7A and 7B are main cross-sectional views of an interchangeable lens barrel of a single lens reflex camera as an embodiment of the optical apparatus of the present invention. FIG. 8 is an exploded perspective view of an interchangeable lens barrel of a single lens reflex camera as an embodiment of the optical apparatus of the present invention. A fixing barrel 712, a linear guide barrel 713, and a front lens group barrel 714 are fixed to the detachable mount 711 with a camera. These barrels are fixing members of the interchangeable lens barrel.

The linear guide barrel 713 is provided with a forward guide groove 713a for the focus lens 702 in the optical axis direction. Cam rollers 717a and 717b protruding to the outside in the diameter direction are fixed, with an axial screw 718, to the rear lens group barrel 716 holding the focus lens 702. The cam roller 717a fits in the forward guide groove 713a.

A cam ring 715 turnably fits in the inner circumference of the linear guide barrel 713. Relative displacement between the linear guide barrel 713 and the cam ring 715 is restricted in the optical axis direction by fitting the roller 719 fixed to the cam ring 715 in the circumferential groove 713b of the linear guide barrel 713. The cam ring 715 is provided with a cam groove 715a for the focus lens 702, and the cam roller 717b also fits in the cam groove 715a.

A rotation transmitting ring 720 is disposed on the outer circumference side of the fixing barrel 712 and is held by a ball race 727 so as to be turnable at a fixed position with respect to the fixing barrel 712. The rotation transmitting ring 720 has a shaft 720f radially extending from the rotation transmitting ring 720, and a driven roller 722 is turnably held by the shaft 720f. The large-diameter portion 722a of the driven roller 722 is in contact with the mount side end face 724b of the manual focus ring 724. The small-diameter portion 722b of the driven roller 722 is in contact with a connecting member 729. Six driven rollers 722 are disposed on the outer circumference of the rotation transmitting ring 720 at equal intervals, and each driven roller is disposed as described above.

A low friction sheet (washer member) 733 is disposed at the inner diameter portion of the manual focus ring 724 so as to be held between the mount side end face 712a of the fixing barrel 712 and the front side end face 724a of the manual focus ring 724. The outer diameter surface of the low friction sheet 733 is in a ring shape and fits in the inner diameter portion 724c of the manual focus ring 724, and the inner diameter portion 724c of the manual focus ring 724 further fits in the outer diameter portion 712b of the fixing barrel 712. The low friction sheet 733 reduces the friction in the turning ring mechanism for relatively turning the manual focus ring 724 around the optical axis with respect to the fixing barrel 712.

The large-diameter portion 722a of the driven roller 722 and the mount side end face 724a of the manual focus ring are in contact with each other with the pressure applied by the force of a wave washer 726 for pressing the ultrasonic motor 725 toward the front of the lens. Similarly, the small-diameter portion 722b of the driven roller 722 and the connecting member 729 are in contact with each other by the force of the wave washer 726 for pressing the ultrasonic motor 725 toward the front of the lens. The wave washer 726 is restricted in the movement toward the mount direction by a washer 732 bayonet-connected to the fixing barrel 712. The spring force (biasing force) generated by the wave washer 726 is transmitted to the ultrasonic motor 725 and further to the driven roller 722 and thereby also serves as a pressing force against the mount side end face 712a of the fixing barrel 712 by the manual focus ring 724. That is, the manual focus ring 724 is incorporated so as to be pressed to the mount side end face 712a of the fixing barrel 712 via the low friction sheet 733.

Consequently, when the ultrasonic motor 725 is driven so as to turn with respect to the fixing barrel 712 by controller (not shown), since the connecting member 729 is in a frictional contact with the small-diameter portion 722b of the driven roller 722, the driven roller 722 turns around the shaft 720f. The turning of the driven roller 722 around the shaft 720f results in turning of the rotation transmitting ring 720 around the optical axis (autofocus operation).

When a turning force around the optical axis is applied to the manual focus ring 724 from a manual manipulation input unit (not shown), the mount side end face 724b of the manual focus ring 724 is brought into a pressing-contact with the large-diameter portion 722a of the driven roller 722. As a result, the driven roller 722 turns around the shaft 720f by the frictional force. The turning of the large-diameter portion 722a of the driven roller 722 around the shaft 720f turns the rotation transmitting ring 720 around the optical axis. On this occasion, the friction holding power of a rotor 725c and a stator 725b prevents the ultrasonic motor 725 from being turned (manual focus operation).

The rotation transmitting ring 720 is provided with two focus keys 728 at positions to oppose each other. The focus keys 728 fit in the notches 715b formed at the end portion of the cam ring 715. Consequently, turning of the rotation transmitting ring 720 around the optical axis by the autofocus operation or the manual focus operation is transmitted to the cam ring 715 via the focus keys 728 to turn the cum ring around the optical axis. As a result, the rear lens group barrel 716 that is restricted in turning by the cam roller 717a and the forward guide groove 713a moves along the cam groove 715a of the cam ring 715 by the cam roller 717b. Thus, the focus lens 702 is driven to perform focus operation.

Here, an interchangeable lens barrel of a single lens reflex camera has been described as an example of the optical apparatus of the present invention. The present invention can be applied to any optical apparatus having an ultrasonic motor in the driving unit, such as a compact camera, an electronic still camera, or a portable terminal with a camera, regardless of the types of cameras.

(Vibratory Device and Dust Removing Device)

Vibratory devices for, for example, conveying or removing particles, powder, or droplets are widely used in electronic apparatuses.

A dust removing device including the piezoelectric element of the present invention will now be described as an example of the vibratory device of the present invention. The vibratory device according to the present invention at least includes a vibratory body having a diaphragm provided with the piezoelectric element or the multilayered piezoelectric element.

Figure 9A:
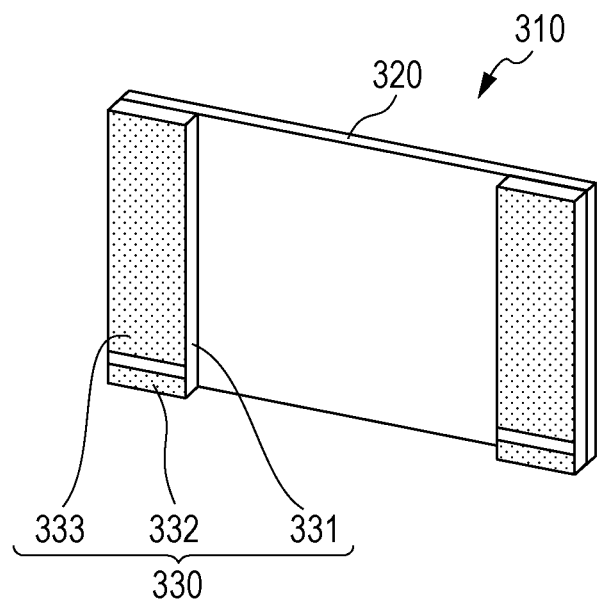
FIGS. 9A and 9B are schematic diagrams illustrating an embodiment when a vibratory device of the present invention is used as a dust removing device.
Figure 9B:
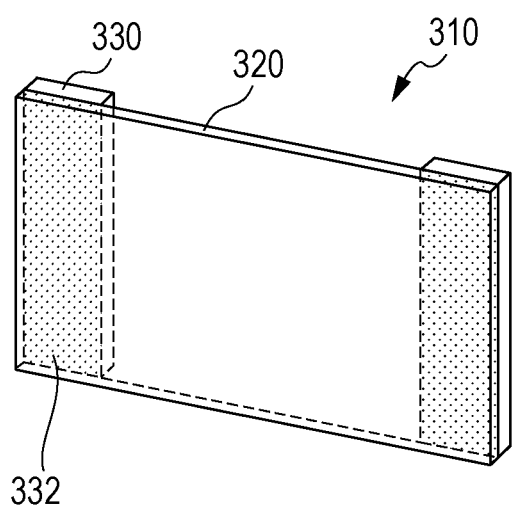

FIGS. 9A and 9B are schematic diagrams illustrating an embodiment of the dust removing device of the present invention. The dust removing device 310 is constituted of a tabular piezoelectric element 330 and a diaphragm 320. The piezoelectric element 330 may be a multilayered piezoelectric element of the present invention. The diaphragm 320 may be made of any material. When the dust removing device 310 is used in an optical device, a transparent material or a light-reflective material can be used as the diaphragm 320.

Figure 10A:
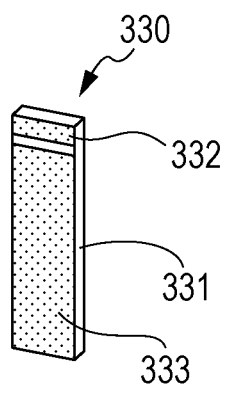
FIGS. 10A to 10C are schematic diagrams illustrating the configuration of a piezoelectric element in a dust removing device of the present invention.
Figure 10B:
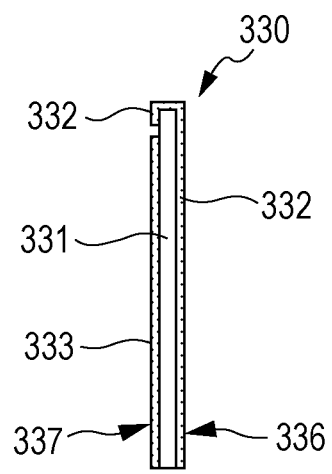
Figure 10C:
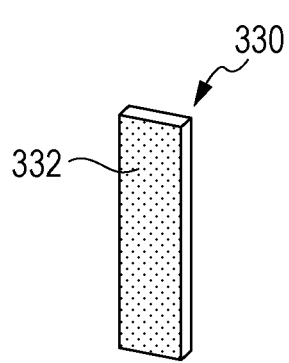

FIGS. 10A to 10C are schematic diagrams illustrating the configuration of a piezoelectric element 330 shown in FIGS. 9A and 9B. FIGS. 10A and 10C illustrate the structures of the front and the rear faces of the piezoelectric element 330, and FIG. 10B illustrates the structure of the side face. As shown in FIGS. 9A and 9B (FIGS. 10A to 10C), the piezoelectric element 330 is composed of a piezoelectric material 331, a first electrode 332, and a second electrode 333, and the first electrode 332 and the second electrode 333 are respectively arranged on the surfaces of the tabular piezoelectric material 331 so as to oppose each other. As in the piezoelectric element shown in FIGS. 9A and 9B, the piezoelectric element 330 may be a multilayered piezoelectric element of the present invention. In such a case, the piezoelectric material 331 has a structure having piezoelectric material layers and internal electrodes alternately arranged, and the internal electrodes are alternately short-circuited with the first electrode 332 or the second electrode 333 to give a driving waveform to each layer of the piezoelectric material with different phases. The face of the first electrode 332 of the piezoelectric element 330 shown in FIG. 10C is a first electrode face 336, and the face of the second electrode 333 of the piezoelectric element 330 shown in FIG. 10A is a second electrode face 337.

Here, the electrode face in the present invention indicates the face of the piezoelectric element on which the electrode is disposed. For example, as shown in FIGS. 10A to 10C, the first electrode 332 may go around to the second electrode face 337.

As shown in FIGS. 9A and 9B, the first electrode face 336 of the piezoelectric element 330 is fixed to the plate face of the diaphragm 320. Stress is generated between the piezoelectric element 330 and the diaphragm 320 by driving the piezoelectric element 330 to generate out-of-plane vibration in the diaphragm. The dust removing device 310 of the present invention is a device for removing foreign substance such as dust adhered to the surface of the diaphragm 320 by the out-of-plane vibration of the diaphragm 320. The term "out-of-plane vibration" refers to elastic vibration that displaces the diaphragm in the optical axis direction, i.e., in the thickness direction of the diaphragm.

Figure 11A:
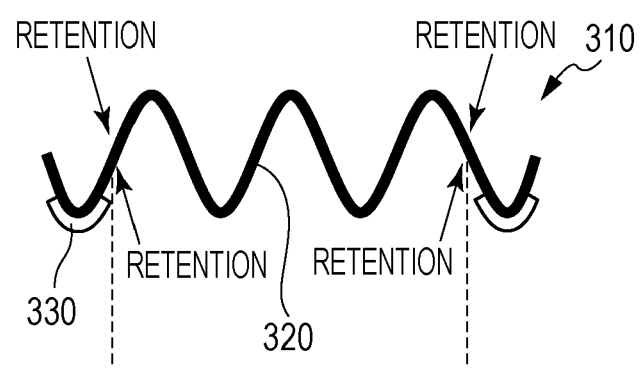
FIGS. 11A and 11B are schematic diagrams illustrating the vibration principle of a dust removing device of the present invention.
Figure 11B:
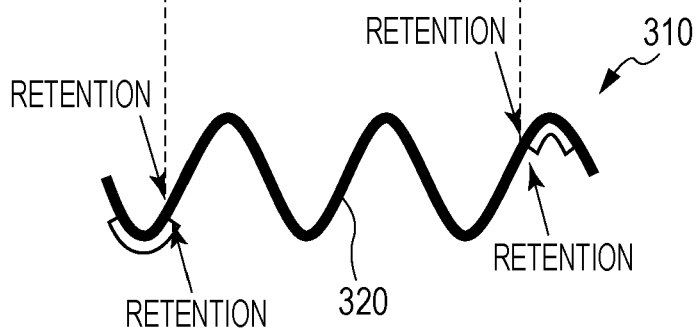

FIGS. 11A and 11B are schematic diagrams illustrating the vibration principle of the dust removing device 310 of the present invention. FIG. 11A shows a state of generating out-of-plane vibration in the diaphragm 320 by applying an in-phase alternating voltage to a pair of piezoelectric elements 330. The polarization direction of the piezoelectric material constituting the pair of piezoelectric elements 330 is identical with the thickness direction of the piezoelectric elements 330. The dust removing device 310 is driven by a seventh vibration mode. FIG. 11B shows a state of generating out-of-plane vibration in the diaphragm 320 by applying a reverse-phase alternating voltage having a phase opposite by 180° to a pair of piezoelectric elements 330. The dust removing device 310 is driven by a sixth vibration mode. The dust removing device 310 of the present invention can effectively remove dust adhered to the surface of a diaphragm by properly using at least two vibration modes.

(Image Pickup Device)

Figure 12:
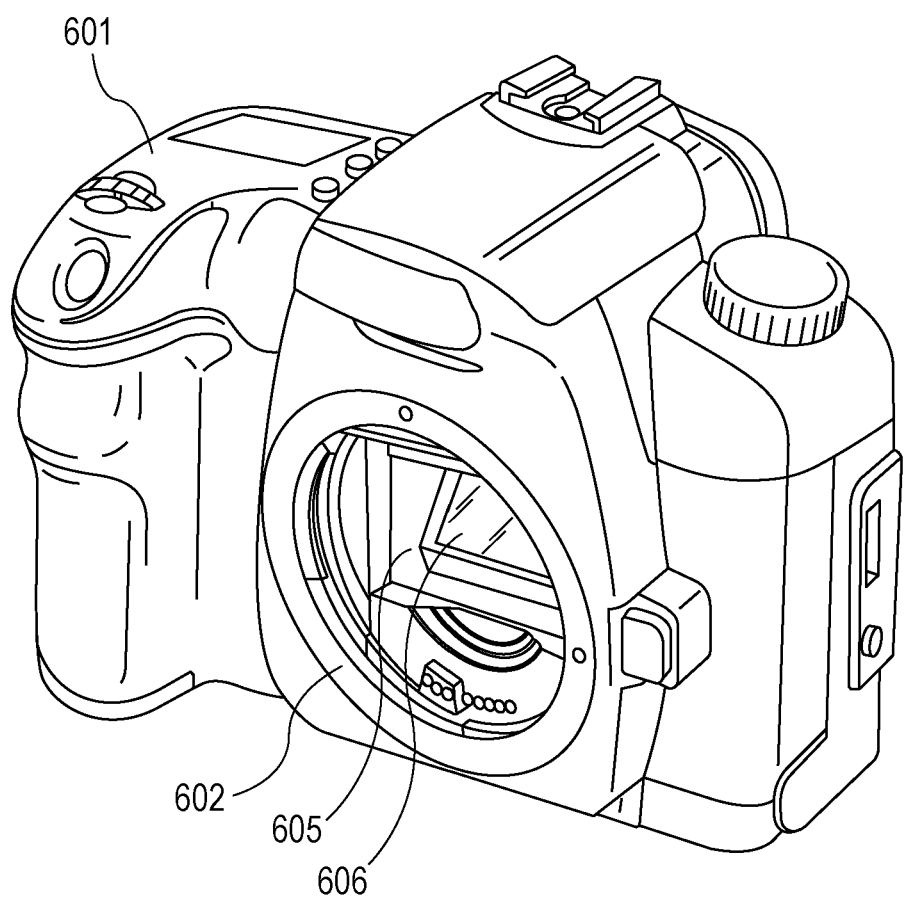
FIG. 12 is a schematic diagram illustrating an embodiment of an image pickup device of the present invention.
Figure 13:
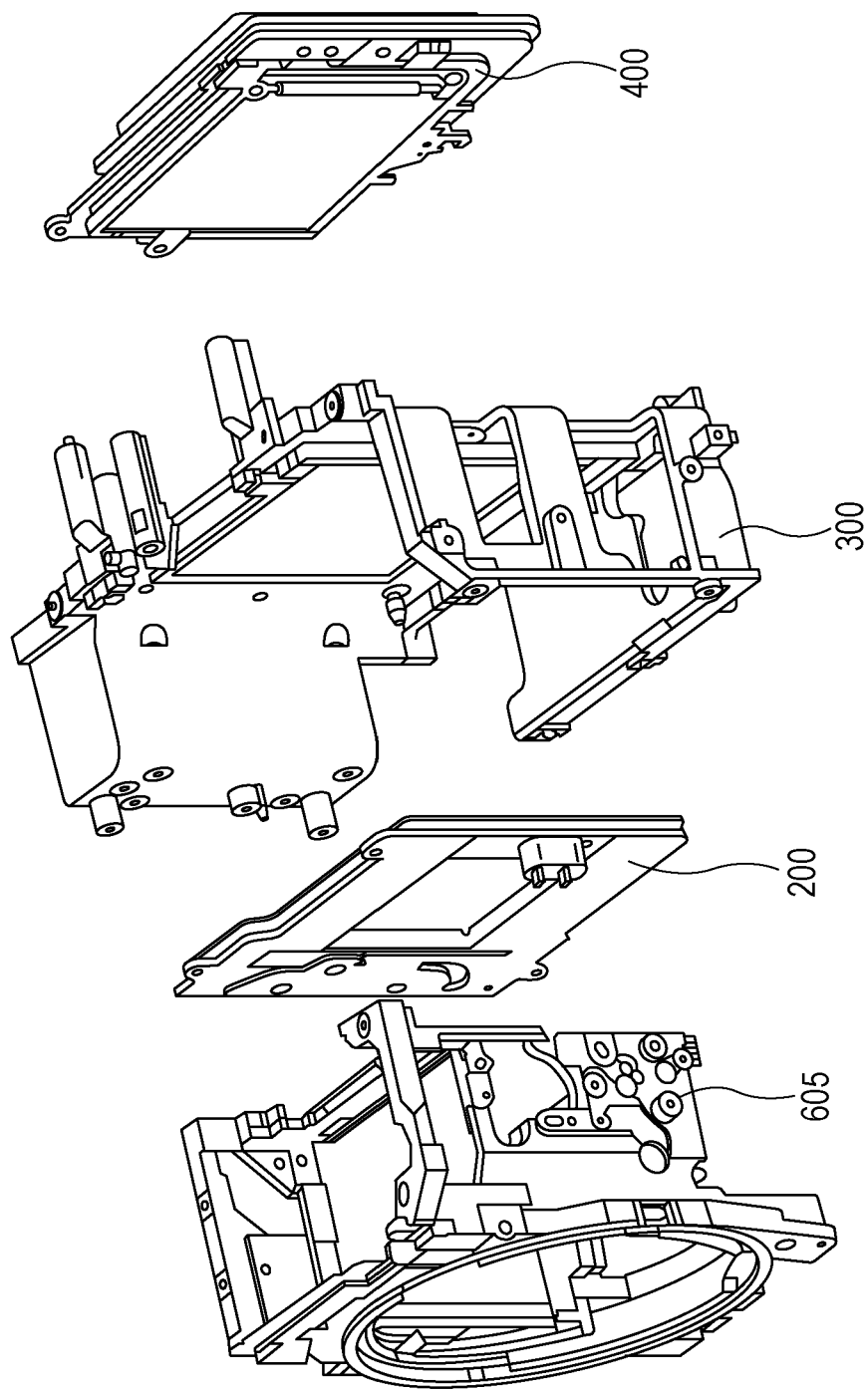
FIG. 13 is a schematic diagram illustrating an embodiment of an image pickup device of the present invention.

The image pickup device of the present invention will now be described. The image pickup device of the present invention at least includes the dust removing device and an image pickup element unit and has the diaphragm of the dust removing device on the light-receiving surface side of the image pickup element unit. FIGS. 12 and 13 are diagrams illustrating a digital single lens reflex camera as an embodiment of the image pickup device of the present invention.

FIG. 12 is a front perspective view of a camera body 601 viewed from the object side, in a state in which the image pickup lens unit is removed. FIG. 13 is an exploded perspective view schematically illustrating the structure of the inside of the camera for describing the dust removing device of the present invention and the surrounding structure of a pickup unit 400.

A mirror box 605 into which image pickup light beams passed through the image pickup lens are guided is disposed inside the camera body 601. Main mirror (quick return mirror) 606 is disposed inside the mirror box 605. The main mirror 606 can take a state in which the main mirror 606 is held at an angle of 45° with respect to the image pickup optical axis for guiding image pickup light beams to the direction of the penta roof mirror (not shown) and a state in which the main mirror 606 is held at a position evacuated from image pickup light beams for guiding the image pickup light beams to the direction of the image pickup element (not shown).

On the object side of the body chassis 300 serving as the skeleton of the camera body, the mirror box 605 and a shutter unit 200 are disposed in this order from the object side. Furthermore, an image pickup unit 400 is disposed on the photographer side of the body chassis 300. The image pickup unit 400 is set to the clamp face of the mount portion 602 serving as the basis for setting the image pickup lens unit such that the image pickup face of the image pickup element is parallel to the clamp face with a predetermined distance therebetween.

The image pickup unit 400 is constituted of the vibration member of a dust removing device and an image pickup element unit. The vibration member of the dust removing device and the light-receiving surface of the image pickup element unit are disposed on the same axis.

Herein, a digital single lens reflex camera has been described as an example of the image pickup device of the present invention. The image pickup device may be, for example, an image pickup lens interchangeable camera such as a mirror-less digital single lens camera not having the mirror box 605. The present invention can also be applied to any apparatus required to remove dust adhering to the surfaces of, in particular, the optical parts of various image pickup devices, such as image pickup unit interchangeable video cameras, copiers, facsimile machines, and scanners, or electronic electric apparatuses having image pickup devices.

(Electronic Apparatus)

The electronic apparatus of the present invention will now be described. The electronic apparatus of the present invention includes a piezoelectric acoustic component having the piezoelectric element or the multilayered piezoelectric element. Examples of the piezoelectric acoustic component include loudspeakers, buzzers, microphones, and surface acoustic wave (SAW) elements.

Figure 14:
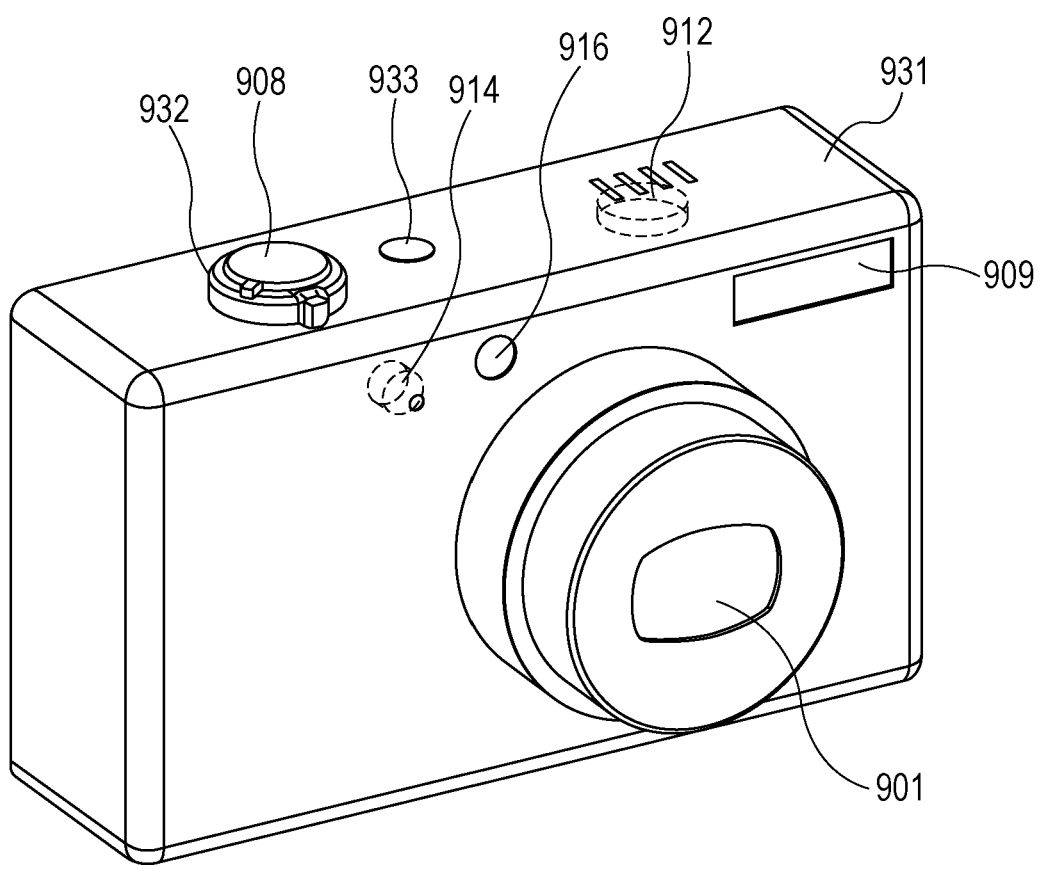
FIG. 14 is a schematic diagram illustrating an embodiment of an electronic apparatus of the present invention.

FIG. 14 is a perspective general view of a digital camera body 931, an embodiment of the electronic apparatus of the present invention, viewed from the front. On the front of the body 931, an optical device 901, a microphone 914, a stroboscope light emitting unit 909, and an assist light unit 916 are disposed. The microphone 914 is incorporated in the inside of the body and is therefore indicated by a dashed line. A hole is provided in the body on the front of the microphone 914 for picking up sounds from the outside.

On the upper face of the body 931, a power button 933, a loudspeaker 912, a zoom lever 932, and a release button 908 for performing the focusing operation are arranged. The loudspeaker 912 is incorporated in the inside of the body 931 and is therefore indicated by a dashed line. Holes are provided in the body on the front of the loudspeaker 912 for transmitting sounds to the outside.

The piezoelectric acoustic component of the present invention is used in at least one of the microphone 914, the loudspeaker 912, and the surface acoustic wave element.

Herein, a digital camera has been described as the electronic apparatus of the present invention. The present invention can also be applied to electronic apparatuses having various piezoelectric acoustic components such as sound reproducers, recorders, cellular phones, and information terminals.

As described above, the piezoelectric element or the multilayered piezoelectric element of the present invention can be suitably applied to liquid discharge heads, liquid discharge devices, ultrasonic motors, optical apparatuses, vibratory devices, dust removing devices, image pickup devices, and electronic apparatuses. They are particularly suitable for operation at low temperature.

The use of the piezoelectric element or the multilayered piezoelectric element of the present invention can provide a liquid discharge head having a nozzle density and a discharge rate that are equivalent to or higher than those in the case of using a piezoelectric element containing lead.

The use of the liquid discharge head of the present invention can provide a liquid discharge device having a discharge rate and a discharge precision that are equivalent to or higher than those in the case of using a piezoelectric element containing lead.

The use of the piezoelectric element or the multilayered piezoelectric element of the present invention can provide an ultrasonic motor having a driving power and durability that are equivalent to or higher than those in the case of using a piezoelectric element containing lead.

The use of the ultrasonic motor of the present invention can provide an optical apparatus having durability and an operation precision that are equivalent to or higher than those in the case of using a piezoelectric element containing lead.

The use of the piezoelectric element or the multilayered piezoelectric element of the present invention can provide a vibratory device having a vibration ability and durability that are equivalent to or higher than those in the case of using a piezoelectric element containing lead.

The use of the vibratory device of the present invention can provide a dust removing device having a dust removing efficiency and durability that are equivalent to or higher than those in the case of using a piezoelectric element containing lead.

The use of the dust removing device of the present invention can provide an image pickup device having a dust removing function that is equivalent to or higher than that in the case of using a piezoelectric element containing lead.

The use of a piezoelectric acoustic component including the piezoelectric element or the multilayered piezoelectric element of the present invention can provide an electronic apparatus having a sound-producing ability that is equivalent to or higher than that in the case of using a piezoelectric element containing lead.

The piezoelectric material of the present invention can be used not only in liquid discharge heads and motors but also in devices such as ultrasonic vibrators, piezoelectric actuators, piezoelectric sensors, and ferroelectric memories.

EXAMPLES

The present invention will now be more specifically described by examples, but the present invention is not limited to the following examples.

A piezoelectric material of the present invention was produces as follows.
(Piezoelectric Material)

Piezoelectric Material of Example 1

Raw materials corresponding to a composition represented by Formula 1: $(Ba_{1-x}Ca_x)_a(Ti_{1-y}Zr_y)O_3$, wherein x=0.080, y=0.070, and a=1.0022, i.e., $(Ba_{0.920}Ca_{0.080})_{1.0022}(Ti_{0.930}Zr_{0.070})O_3$, were weighed as follows.

A barium titanate raw material powder having an average particle diameter of 100 nm and a purity of 99.99% or more, a calcium titanate raw material powder having an average particle diameter of 300 nm and a purity of 99.99% or more, and a calcium zirconate raw material powder having an average particle diameter of 300 nm and a purity of 99.99% or more were produced by a solid-phase method and were weighed at a ratio of Ba, Ca, Ti, and Zr to give a composition $(Ba_{0.920}Ca_{0.080})_{1.0022}(Ti_{0.930}Zr_{0.070})O_3$. In order to adjust the "a" showing the ratio of the molar amount of Ba and Ca at the A site to the molar amount of Ti and Zr at the B site, barium carbonate and calcium carbonate were used.

Manganese dioxide was weighed such that the content of Mn of the first auxiliary component was 0.150 parts by weight based on 100 parts by weight of the composition $(Ba_{0.920}Ca_{0.080})_{1.0022}(Ti_{0.930}Zr_{0.070})O_3$ on a metal basis. Bismuth oxide was weighed such that the content of Bi of the second auxiliary component was 0.260 parts by weight based on 100 parts by weight of the metal oxide as the main component on a metal basis. Silicon dioxide and boron oxide were weighed as the fourth auxiliary component such that the contents of Si and B were respectively 0.033 parts by weight and 0.017 parts by weight based on 100 parts by weight of the metal oxide as the main component on a metal basis.

These weighed powders were mixed by dry blending with a ball mill for 24 hours. To the resulting mixed powder, 3 parts by weight of a PVA binder was sprayed with a spray dryer so as to adhere to the mixed powder surfaces for granulation.

Subsequently, a mold was filled with the resulting granulated powder, and the granulated powder was formed into a disk-shaped green compact by applying a molding pressure of 200 MPa to the mold with a press molding machine. The green compact may be further pressed with a cold isostatic pressing molding machine. In also such a case, similar results were obtained.

The resulting green compact was put in an electric furnace, was held at a maximum temperature $T_{max}$ of 1200° C. for 4 hours, and was sintered in an ambient atmosphere over 24 hours in total to obtain a piezoelectric ceramic of this Example.

The average equivalent circular diameter and the relative density of the crystal grains constituting the piezoelectric ceramic were evaluated and were 1.05 μm and 98.1%, respectively. The crystal grains were mainly observed with a polarizing microscope, but the crystal grains having a small grain diameter were observed with a scanning electron microscope (SEM). The average equivalent circular diameter was calculated by image processing of an image photographed with a polarizing microscope or a scanning electron microscope. The relative density was evaluated by an Archimedes's method.

Subsequently, the ceramic was ground into a thickness of 0.5 mm, and the crystal structure was analyzed by X-ray diffraction. Only a peak corresponding to a perovskite structure was observed.

The composition of the resulting ceramic was evaluated by ICP emission spectrometric analysis. The result demonstrated that the main component of the piezoelectric material was a metal oxide represented by a chemical formula: $(Ba_{0.920}Ca_{0.080})_{1.0022}(Ti_{0.930}Zr_{0.070})O_3$ and that 0.150 parts by weight of Mn, 0.260 parts by weight of Bi, 0.0001 parts by weight of Mg, 0.033 parts by weight of Si, and 0.017 parts by weight of B were each contained on a metal basis in 100 parts by weight of the metal oxide as the main component.

Observation of the crystal grains was performed again and demonstrated that there was no significant difference in average equivalent circular diameter between before and after the grinding.

Piezoelectric Materials of Examples 2 to 24

Piezoelectric materials of Examples 2 to 24 were produced as in Example 1 except that a lithium carbonate power was optionally used in addition to the raw materials used in Example 1. First, each raw material powder was weighed such that the ratios of Ba, Ca, Ti, and Zr were as shown in Table 1. In order to adjust the "a" showing the ratio of the molar amount of Ba and Ca at the A site to the molar amount of Ti and Zr at the B site, barium carbonate and calcium carbonate were used. Subsequently, manganese dioxide, bismuth oxide, lithium carbonate, silicon dioxide, and boron oxide were weighed such that the ratios of the content of Mn of the first auxiliary component, the contents of Bi and Li of the second auxiliary component, and the contents of Si and B of the fourth auxiliary component were as shown in Table 1, on a metal basis, based on 100 parts by weight of the sum of weighed amounts (total amount) of barium titanate, calcium titanate, calcium zirconate, barium carbonate, and calcium carbonate in terms of chemical formula: $(Ba_{1-x}Ca_x)_a(Ti_{1-y}Zr_y)O_3$.

These weighed powders were mixed by dry blending with a ball mill for 24 hours. To the resulting mixed powder, 3 parts by weight of a PVA binder was sprayed with a spray dryer so as to adhere to the mixed powder surfaces for granulation. In Examples 17 to 20, magnesium oxide was mixed in amounts of 0.0049, 0.0099, 0.0499, and 0.0999 parts by weight, respectively, on a metal basis.

Subsequently, a mold was filled with the resulting granulated powder, and the granulated powder was formed into a disk-shaped green compact by applying a molding pressure of 200 MPa to the mold with a press molding machine.

The resulting green compact was put in an electric furnace, was held at a maximum temperature $T_{max}$ shown in Table 1 for 4 hours, and was sintered in an ambient atmosphere over 24 hours in total to obtain a piezoelectric ceramic of the present invention.

The average equivalent circular diameter and the relative density were evaluated as in Example 1. The results are shown in Table 2.

The composition of each piezoelectric material was analyzed as in Example 1. The results demonstrated that in all piezoelectric materials, the composition of Ba, Ca, Ti, Zr, Mn, Bi, Li, Si, and B after sintering was the same as the weighed composition. It was demonstrated that in Examples 2 to 16, the contents of Mg were each 0.0001 parts by weight based on 100 parts by weight of the metal oxide in terms of chemical formula: $(Ba_{1-x}Ca_x)_a(Ti_{1-y}Zr_y)O_3$, whereas in Examples 17 to 20, the contents of Mg were 0.0050, 0.0100, 0.0500, and 0.1000 parts by weight.

TABLE 1

| | Main component | | | | | First auxiliary component | Second auxiliary component | | Fourth auxiliary component | | | |
|---|---|---|---|---|---|---|---|---|---|---|---|---|
| | | | | | | Mn | Bi | Li | Si | B | Total | Maximum |
| | Ba 1−x | Ca x | Ti 1−y | Zr y | A/B a | parts by weight | parts by weight | parts by weight | parts by weight | parts by weight | parts by weight | temperature Tmax [° C.] |
| Example 1 | 0.920 | 0.080 | 0.930 | 0.070 | 1.0022 | 0.150 | 0.260 | 0 | 0.033 | 0.017 | 0.050 | 1200 |
| Example 2 | 0.920 | 0.080 | 0.930 | 0.070 | 1.0017 | 0.150 | 0.260 | 0 | 0.033 | 0.017 | 0.050 | 1200 |
| Example 3 | 0.920 | 0.080 | 0.950 | 0.050 | 1.0032 | 0.180 | 0.260 | 0 | 0.033 | 0.017 | 0.050 | 1200 |
| Example 4 | 0.920 | 0.080 | 0.950 | 0.050 | 1.0060 | 0.240 | 0.260 | 0 | 0.033 | 0.017 | 0.050 | 1200 |
| Example 5 | 0.920 | 0.080 | 0.950 | 0.050 | 1.0085 | 0.300 | 0.260 | 0 | 0.033 | 0.017 | 0.050 | 1200 |
| Example 6 | 0.920 | 0.080 | 0.970 | 0.030 | 1.0105 | 0.300 | 0.170 | 0 | 0.033 | 0.017 | 0.050 | 1200 |
| Example 7 | 0.930 | 0.070 | 0.970 | 0.030 | 1.0012 | 0.100 | 0.260 | 0 | 0.033 | 0.017 | 0.050 | 1200 |
| Example 8 | 0.970 | 0.030 | 0.920 | 0.080 | 1.0077 | 0.150 | 0.260 | 0 | 0.033 | 0.017 | 0.050 | 1200 |
| Example 9 | 0.970 | 0.030 | 0.970 | 0.030 | 1.0077 | 0.150 | 0.260 | 0 | 0.033 | 0.017 | 0.050 | 1200 |
| Example 10 | 0.912 | 0.088 | 0.970 | 0.030 | 1.0062 | 0.150 | 0.260 | 0 | 0.033 | 0.017 | 0.050 | 1200 |
| Example 11 | 0.912 | 0.088 | 0.920 | 0.080 | 1.0067 | 0.150 | 0.260 | 0 | 0.033 | 0.017 | 0.050 | 1200 |
| Example 12 | 0.920 | 0.080 | 0.930 | 0.070 | 1.0022 | 0.150 | 0.260 | 0 | 0 | 0 | 0 | 1340 |
| Example 13 | 0.912 | 0.088 | 0.970 | 0.030 | 1.0022 | 0.150 | 0.260 | 0 | 0 | 0 | 0 | 1340 |
| Example 14 | 0.970 | 0.030 | 0.970 | 0.030 | 1.0022 | 0.100 | 0.260 | 0 | 0 | 0 | 0 | 1340 |
| Example 15 | 0.920 | 0.080 | 0.930 | 0.070 | 0.9900 | 0.150 | 0.260 | 0.005 | 0.033 | 0.005 | 0.038 | 1200 |
| Example 16 | 0.912 | 0.088 | 0.970 | 0.030 | 1.0022 | 0.150 | 0.260 | 0.014 | 0.033 | 0.017 | 0.050 | 1200 |
| Example 17 | 0.970 | 0.030 | 0.970 | 0.030 | 1.0180 | 0.150 | 0.260 | 0.028 | 0.033 | 0.024 | 0.057 | 1200 |
| Example 18 | 0.920 | 0.080 | 0.930 | 0.070 | 1.0022 | 0.150 | 0.260 | 0 | 4.000 | 0 | 4.000 | 1180 |
| Example 19 | 0.920 | 0.080 | 0.930 | 0.070 | 1.0022 | 0.150 | 0.260 | 0 | 0 | 4.000 | 4.000 | 1180 |
| Example 20 | 0.920 | 0.080 | 0.930 | 0.070 | 1.0022 | 0.050 | 0.260 | 0 | 2.000 | 2.000 | 4.000 | 1180 |
| Example 21 | 0.920 | 0.080 | 0.930 | 0.070 | 1.0022 | 0.040 | 0.260 | 0 | 0.033 | 0.017 | 0.050 | 1200 |
| Example 22 | 0.920 | 0.080 | 0.930 | 0.070 | 1.0022 | 0.480 | 0.260 | 0 | 0.033 | 0.017 | 0.050 | 1200 |
| Example 23 | 0.920 | 0.080 | 0.930 | 0.070 | 1.0022 | 0.150 | 0.050 | 0 | 0.033 | 0.017 | 0.050 | 1200 |
| Example 24 | 0.920 | 0.080 | 0.930 | 0.070 | 1.0022 | 0.150 | 0.810 | 0 | 0.033 | 0.017 | 0.050 | 1200 |

TABLE 1-continued

| | Main component | | | | | First auxiliary component Mn | Second auxiliary component | | Fourth auxiliary component | | | Maximum temperature Tmax [° C.] |
|---|---|---|---|---|---|---|---|---|---|---|---|---|
| | Ba $1-x$ | Ca $x$ | Ti $1-y$ | Zr $y$ | A/B a | parts by weight | Bi parts by weight | Li parts by weight | Si parts by weight | B parts by weight | Total parts by weight | |
| Comparative Example 1 | 1.000 | 0 | 0.950 | 0.050 | 1.0042 | 0.150 | 0.082 | 0 | 0.033 | 0.017 | 0.050 | 1200 |
| Comparative Example 2 | 0.700 | 0.300 | 0.950 | 0.050 | 1.0042 | 0.150 | 0.260 | 0 | 0.033 | 0.017 | 0.050 | 1250 |
| Comparative Example 3 | 0.920 | 0.080 | 1.000 | 0 | 1.0032 | 0.150 | 0.260 | 0 | 0.033 | 0.017 | 0.050 | 1220 |
| Comparative Example 4 | 0.920 | 0.080 | 0.800 | 0.200 | 1.0032 | 0.150 | 0.260 | 0 | 0.033 | 0.017 | 0.050 | 1220 |
| Comparative Example 5 | 0.920 | 0.080 | 0.950 | 0.050 | 0.9638 | 0.150 | 0.260 | 0 | 0.033 | 0.017 | 0.050 | 1250 |
| Comparative Example 6 | 0.920 | 0.080 | 0.950 | 0.050 | 1.0462 | 0.150 | 0.260 | 0 | 0.033 | 0.017 | 0.050 | 1250 |
| Comparative Example 7 | 0.920 | 0.080 | 0.950 | 0.050 | 0.9990 | 0 | 0.260 | 0 | 0.033 | 0.017 | 0.050 | 1200 |
| Comparative Example 8 | 0.920 | 0.080 | 0.950 | 0.050 | 1.0406 | 1.000 | 0.260 | 0 | 0.033 | 0.017 | 0.050 | 1200 |
| Comparative Example 9 | 0.920 | 0.080 | 0.970 | 0.030 | 1.1237 | 0.300 | 0.015 | 0 | 0.033 | 0.017 | 0.050 | 1200 |
| Comparative Example 10 | 0.920 | 0.080 | 0.950 | 0.050 | 1.0022 | 0.150 | 1.700 | 0 | 0.033 | 0.017 | 0.050 | 1250 |
| Comparative Example 11 | 0.920 | 0.080 | 0.950 | 0.050 | 1.0062 | 0.150 | 0.260 | 0.3 | 0.033 | 0.017 | 0.050 | 1250 |
| Comparative Example 12 | 0.900 | 0.100 | 1.000 | 0 | 1.0060 | 0.144 | 0 | 0 | 0 | 0 | 0 | 1300 |
| Comparative Example 13 | 0.850 | 0.150 | 0.900 | 0.100 | 1.0022 | 0 | 0 | 0 | 0 | 0 | 0 | 1300 |

TABLE 2

| | Average equivalent circular diameter [μm] | Relative density [%] |
|---|---|---|
| Example 1 | 1.05 | 98.1 |
| Example 2 | 3.10 | 97.1 |
| Example 3 | 0.87 | 97.4 |
| Example 4 | 2.56 | 96.8 |
| Example 5 | 2.83 | 97.6 |
| Example 6 | 3.50 | 97.5 |
| Example 7 | 2.42 | 97.0 |
| Example 8 | 3.58 | 98.0 |
| Example 9 | 3.28 | 97.8 |
| Example 10 | 0.95 | 96.1 |
| Example 11 | 0.90 | 95.9 |
| Example 12 | 6.72 | 99.1 |
| Example 13 | 6.54 | 98.5 |
| Example 14 | 6.02 | 98.9 |
| Example 15 | 1.03 | 95.0 |
| Example 16 | 0.98 | 96.0 |
| Example 17 | 3.30 | 97.3 |
| Example 18 | 0.91 | 96.5 |
| Example 19 | 0.83 | 96.9 |
| Example 20 | 0.95 | 96.3 |
| Example 21 | 1.01 | 94.5 |
| Example 22 | 1.45 | 97.7 |
| Example 23 | 0.97 | 95.3 |
| Example 24 | 1.12 | 96.4 |
| Comparative Example 1 | 1.20 | 93.4 |
| Comparative Example 2 | 1.40 | 93.6 |
| Comparative Example 3 | 0.93 | 93.4 |
| Comparative Example 4 | 1.30 | 94.0 |
| Comparative Example 5 | 40.02 | 95.3 |
| Comparative Example 6 | 0.32 | 88.6 |
| Comparative Example 7 | 0.76 | 94.0 |
| Comparative Example 8 | 6.40 | 93.5 |
| Comparative Example 9 | 0.88 | 94.0 |
| Comparative Example 10 | 5.10 | 92.2 |
| Comparative Example 11 | 3.20 | 91.6 |
| Comparative Example 12 | 5.30 | 91.0 |
| Comparative Example 13 | 3.60 | 90.2 |

Metal Oxide Materials of Comparative Examples 1 to 13

Metal oxide materials for comparison were produced as in Example 1 according to the conditions, shown in Table 1, of the main component, the first auxiliary component, the second auxiliary component, the fourth auxiliary component, the molar ratio "a" of the A site to the B site, and the maximum temperature $T_{max}$ during sintering. In Comparative Example 12, magnesium oxide was mixed such that the Mg weight was 0.4999 parts by weight on a metal basis.

The average equivalent circular diameter and the relative density were evaluated as in Example 1. The results are shown in Table 2.

The composition of each metal oxide material was analyzed as in Example 1. The results demonstrated that in all metal oxide materials, the composition of Ba, Ca, Ti, Zr, Mn, Bi, Li, Si, and B after sintering was the same as the weighed composition. In Comparative Examples 1 to 13, the contents of Mg were each 0.0001 parts by weight based on 100 parts by weight of the metal oxide in terms of chemical formula: $(Ba_{1-x}Ca_x)_a(Ti_{1-y}Zr_y)O_3$.

(Production of Piezoelectric Element)

Piezoelectric elements of the present invention were produced.

Piezoelectric Elements of Examples 1 to 24

Piezoelectric elements were produced using the piezoelectric material of Examples 1 to 24.

A gold electrode having a thickness of 400 nm was formed on each surface of the disk-shaped ceramic by DC sputtering. Incidentally, a titanium adhesive layer having a thickness of 30 nm was formed between each electrode and the ceramic. The resulting ceramic provided with electrodes was cut into a strip-like piezoelectric element of 10×2.5×0.5 mm.

The resulting piezoelectric element was polarized by being applied with an electric field of 14 kV/mm for 30 minutes on a hot plate having a surface temperature of 60° C. to 150° C.

Piezoelectric Elements of Comparative Examples 1 to 13

Comparative elements were produced using the metal oxide materials for comparison prepared in Comparative Examples 1 to 13 and were subjected to polarization treatment as in Examples 1 to 24.

(Characteristic Evaluation of Piezoelectric Elements)

The piezoelectric elements produced using the piezoelectric materials of Examples 1 to 24 and the comparative elements produced using the metal oxide materials of Comparative Examples 1 to 13 were evaluated for the piezoelectric constant $d_{31}$ and the mechanical quality factor Qm within a temperature range (−30° C. to 50° C.) of driving polarized piezoelectric elements. Separately, the dielectric loss at each temperature was measured by applying an AC electric field at a frequency of 1 kHz and a field intensity of 10 V/cm with a commercially available impedance analyzer. The results are shown in Table 3. The symbol "X" in the table refers to that the comparative element had too low resistivity and could not be sufficiently polarized, and no significant result was obtained for the evaluation item.

The environmental temperature was increased with a thermostat from 30° C. to 50° C. by 5° C. increments, then decreased from 50° C. to −30° C. by 5° C. decrements, and further increased from −30° C. to 30° C. by 5° C. increments. The characteristic evaluation was performed after the temperature of the thermostat was kept constant by maintaining each temperature for 10 minutes or more. The piezoelectric constant $d_{31}$ and the mechanical quality factor Qm were determined by a resonance-antiresonance method. The minimum value of the mechanical quality factor Qm and the minimum value of the absolute value $|d_{31}|$ of the piezoelectric constant $d_{31}$ in the temperature range of −30° C. to 50° C. are shown in Table 3. A small piezoelectric constant requires a large electric field for driving a device and is therefore unsuitable for device operation. The piezoelectric constant $|d_{31}|$ is preferably 50 [pm/V] or more and more preferably 60 [pm/V] or more.

The resistivity was measured for evaluating the insulation property. The resistivity was measured using an unpolarized piezoelectric element at room temperature (25° C.) The resistivity was evaluated by the leak current value at 20 seconds after applying a DC voltage of 10 V between two electrodes of each piezoelectric element. The results are shown in Table 3. A resistivity of $1×10^9$ Ω·cm or more, more preferably $50×10^9$ Ω·cm or more, means a sufficient insulation property for practical use of the piezoelectric material or piezoelectric element. The [GΩ·cm] in the column of resistivity of the table denotes [$10^9$ Ω·cm].

TABLE 3

| | Qm at −30° C. | Minimum value of Qm in the range of −30° C. to 50° C. | Minimum value of $|d31|$ in the range of −30° C. to 50° C. [pm/V] | Resistivity at 25° C. [GΩ · cm] | Maximum value of dielectric loss in the range of −30° C. to 50° C. |
|---|---|---|---|---|---|
| Example 1 | 560 | 560 | 96.0 | 236 | 0.0053 |
| Example 2 | 555 | 552 | 97.1 | 242 | 0.0041 |
| Example 3 | 836 | 830 | 73.2 | 310 | 0.0035 |
| Example 4 | 807 | 807 | 67.5 | 152 | 0.0035 |
| Example 5 | 505 | 505 | 68.4 | 263 | 0.0044 |
| Example 6 | 506 | 500 | 60.9 | 15.0 | 0.0055 |
| Example 7 | 874 | 865 | 57.3 | 16.3 | 0.0045 |
| Example 8 | 703 | 700 | 63.0 | 18.0 | 0.0027 |
| Example 9 | 510 | 503 | 114 | 17.0 | 0.0025 |
| Example 10 | 487 | 485 | 104 | 207 | 0.0044 |
| Example 11 | 780 | 780 | 50.7 | 213 | 0.0042 |
| Example 12 | 980 | 978 | 126 | 98.0 | 0.0017 |
| Example 13 | 920 | 920 | 137 | 95.0 | 0.0020 |
| Example 14 | 890 | 890 | 133 | 87.0 | 0.0024 |
| Example 15 | 586 | 580 | 91.2 | 220 | 0.0049 |
| Example 16 | 501 | 500 | 101 | 205 | 0.0044 |
| Example 17 | 520 | 520 | 115 | 15.2 | 0.0059 |
| Example 18 | 480 | 478 | 58.1 | 22.5 | 0.0057 |
| Example 19 | 451 | 441 | 53.6 | 20.3 | 0.0059 |
| Example 20 | 463 | 459 | 54.5 | 21.0 | 0.0058 |
| Example 21 | 510 | 510 | 100 | 207 | 0.0056 |
| Example 22 | 620 | 612 | 85.0 | 245 | 0.0050 |
| Example 23 | 705 | 705 | 88.0 | 223 | 0.0058 |
| Example 24 | 497 | 497 | 102 | 183 | 0.0052 |
| Comparative Example 1 | 156 | 150 | 71.0 | 4.30 | 0.0065 |

TABLE 3-continued

|  | Qm at −30° C. | Minimum value of Qm in the range of −30° C. to 50° C. | Minimum value of \|d31\| in the range of −30° C. to 50° C. [pm/V] | Resistivity at 25° C. [GΩ · cm] | Maximum value of dielectric loss in the range of −30° C. to 50° C. |
|---|---|---|---|---|---|
| Comparative Example 2 | 250 | 250 | 32.5 | 6.30 | 0.0055 |
| Comparative Example 3 | 347 | 344 | 22.7 | 6.00 | 0.0050 |
| Comparative Example 4 | 182 | 180 | 68.0 | 3.00 | 0.0068 |
| Comparative Example 5 | 562 | 560 | 72.8 | 12.0 | 0.0048 |
| Comparative Example 6 | x | x | x | 0.21 | x |
| Comparative Example 7 | 230 | 220 | 85.2 | 1.50 | 0.0055 |
| Comparative Example 8 | 403 | 392 | 33.7 | 1.10 | 0.0100 |
| Comparative Example 9 | 102 | 102 | 66.3 | 8.00 | 0.0065 |
| Comparative Example 10 | 350 | 350 | 31.4 | 12.0 | 0.0061 |
| Comparative Example 11 | 302 | 300 | 33.7 | 10.0 | 0.0067 |
| Comparative Example 12 | 120 | 120 | 30.0 | 1.20 | 0.0065 |
| Comparative Example 13 | 70 | 72 | 85.0 | 1.26 | 0.0069 |

(Evaluation of Piezoelectric Element for High-Temperature Durability)

The piezoelectric elements of Examples 2, 3, 7, and 8 and the comparative elements of Comparative Examples 4 and 13 were put in a thermostat for a high-temperature durability test at 85° C. for 24 hours. The piezoelectric constant $d_{31}$ within a temperature range of −30° C. to 50° C. was evaluated before and after the high-temperature durability test, and the minimum value of the absolute value $|d_{31}|$ was determined. The rate of change in the minimum value $|d_{31}|$ before and after the high-temperature durability test is shown in Table 4.

(Evaluation of Piezoelectric Element for Curie Temperature)

Figure 15:
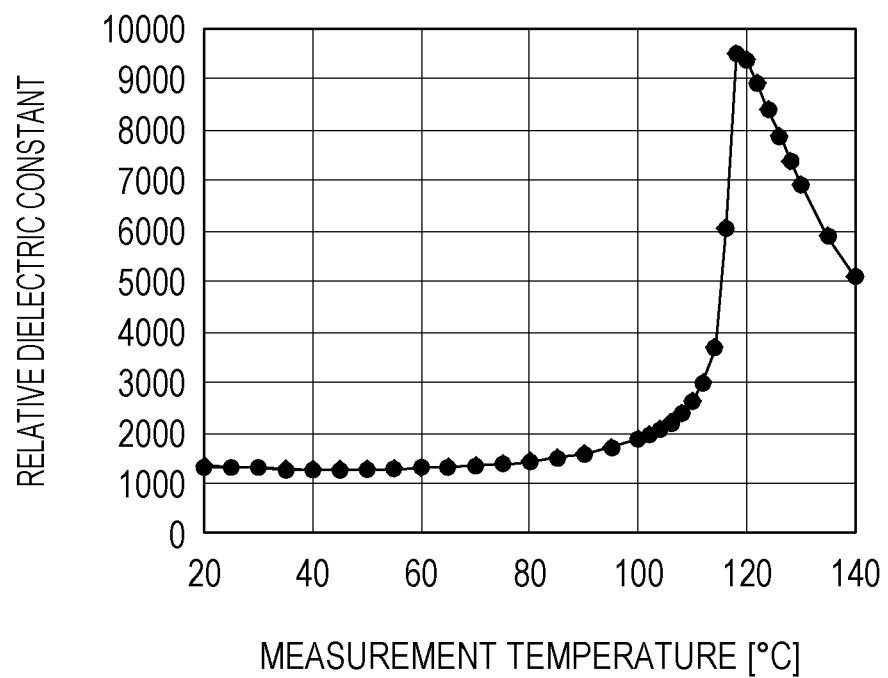
FIG. 15 is a graph showing the temperature dependence of relative dielectric constant of the piezoelectric element in Example 7 of the present invention.

The piezoelectric elements of Examples 2, 3, 7, and 8 and the comparative elements of Comparative Examples 4 and 13 were evaluated for Curie temperature Tc. The Tc was determined from the temperature showing the maximum relative dielectric constant measured using a small AC electric field with changing the temperature. The environmental temperature was increased with a thermostat from 20° C. to 80° C. by 5° C. increments and further increased to 140° C. by 2° C. increments. The evaluation was performed after the temperature of the thermostat was kept constant by maintaining each temperature for 10 minutes or more. The results are shown in Table 4. As an example, the change in relative dielectric constant of the piezoelectric element of Example 7 by environmental temperature is shown in FIG. 15.

compared to those in Examples 1 to 24, and the minimum value of Qm within the device driving temperature range was small, i.e., less than 400.

In Comparative Examples 2 and 12 in which the values of x were larger than 0.090, the minimum values of $|d_{31}|$ within the device driving temperature range were each less than 40 [pm/V], which was small compared to those in Examples 1 to 24.

In Comparative Example 3 in which the value of y was less than 0.030, the minimum values of $|d_{31}|$ within the device driving temperature range was less than 30 [pm/V], which was small compared to those in Examples 1 to 24.

In Comparative Examples 4 and 13 in which the values of y corresponding to the content of Zr were larger than 0.080, the rates of change in $|d_{31}|$ before and after the high-temperature durability test were significantly higher than −10%, compared to those in Examples 2, 3, 7, and 8, and the high-temperature durability was insufficient. This is believed to be caused by a low Curie temperature resulted from that the value of y was larger than 0.080. In Examples 2, 3, 7, and 8 in which the values of y were smaller than 0.080, all of the rates of change in $|d_{31}|$ before and after the high-temperature durability test were less than −5%. Thus, the high-temperature durability was excellent.

In Examples 1 to 24 in which the values of x were 0.030 or more and less than 0.090, and the values of y were 0.030 or more and less than 0.080, the minimum values of Qm

TABLE 4

|  | y | Curie temperature Tc [° C.] | Minimum value of \|d31\| before high-temperature durability test [pm/V] | Minimum value of \|d31\| after high-temperature durability test [pm/V] | Rate of change [%] |
|---|---|---|---|---|---|
| Example 2 | 0.070 | 108 | 97.1 | 93.9 | −3.3 |
| Example 3 | 0.050 | 116 | 73.2 | 71.6 | −2.2 |
| Example 7 | 0.030 | 118 | 57.3 | 56.1 | −2.1 |
| Example 8 | 0.080 | 104 | 63.0 | 60.7 | −3.6 |
| Comparative Example 4 | 0.200 | 82 | 68.0 | 13.3 | −80.5 |
| Comparative Example 13 | 0.100 | 85 | 110.0 | 37.7 | −65.7 |

The results shown in Tables 3 and 4 will now be described.

In Comparative Example 1 in which the value of x corresponding to the content of Ca is less than 0.030, the value of Qm decreased with a decrease in temperature, were 400 or more and the minimum values of $|d_{31}|$ were 50 [pm/V] or more within the device driving temperature range. Thus, the mechanical quality factor and the piezoelectric constant were satisfactory within the device driving temperature range.

In Comparative Example 5 in which the value of "a" was smaller than 0.9860, the average equivalent circular diameter was 40.02 μm, which was large compared to those in Examples 1 to 24, and the crystal grains abnormally grew. The mechanical strength of the element was evaluated by a three-point bending test using a tension and compression tester (manufactured by Orientec Co., Ltd., trade name: Tensilon RTC-1250A). The results were that the mechanical strength of the element of Comparative Example 5 was 15 MPa, which was significantly low compared to 40 MPa or more of the piezoelectric elements of Examples 1 to 24.

In Comparative Example 6 in which the value of "a" was larger than 1.0200, the growth of grains was extremely suppressed, compared to those in Examples 1 to 24, and the relative density was low. As a result, the element of Comparative Example 6 had a low resistivity and could not be sufficiently polarized.

In Comparative Example 7 in which the content of Mn was lower than 0.040 parts by weight, the minimum value of Qm was less than 300, which was low compared to those in Examples 1 to 24. As a result, the electricity consumption for driving the element as a resonance device was high.

In Comparative Example 8 in which the content of Mn was higher than 0.500 parts by weight, the dielectric loss was larger than 0.006, which was large compared to those in Examples 1 to 24.

In Comparative Example 9 in which the content of Bi was lower than 0.042 parts by weight, the minimum value of Qm within the device driving temperature range was significantly lower than 400, which was low compared to those in Examples 1 to 24. As a result, the electricity consumption for driving the element as a resonance device at −30° C. was high.

In Comparative Example 10 in which the content of Bi was larger than 0.850 parts by weight, the minimum value of $|d_{31}|$ was smaller than 50 [pm/V], which was low compared to those in Examples 1 to 24.

In Comparative Example 11 in which the content of Li was larger than 0.028 parts by weight, the minimum value of $|d_{31}|$ was smaller than 50 [pm/V], which was low compared to those in Examples 1 to 24.

(Production and Evaluation of Multilayered Piezoelectric Element)

The multilayered piezoelectric element of the present invention was produced.

Example 25

Raw materials corresponding to a composition represented by Formula 1: $(Ba_{1-x}Ca_x)_a(Ti_{1-y}Zr_y)O_3$, wherein x=0.080, y=0.070, and a=1.0022, i.e., $(Ba_{0.920}Ca_{0.080})_{1.0022}(Ti_{0.930}Zr_{0.070})O_3$, were weighed as follows.

A barium titanate raw material powder having a purity of 99.99% or more, a calcium titanate raw material powder having a purity of 99.99% or more, and a calcium zirconate raw material powder having a purity of 99.99% or more, as main component raw materials, were weighed at a ratio of Ba, Ca, Ti, and Zr to give a composition $(Ba_{0.920}Ca_{0.080})_{1.0022}(Ti_{0.930}Zr_{0.070})O_3$. In order to adjust the "a" showing the ratio of the molar amount of Ba and Ca at the A site to the molar amount of Ti and Zr at the B site, barium carbonate and calcium carbonate were used.

Manganese dioxide was weighed such that the content of Mn of the first auxiliary component was 0.150 parts by weight based on 100 parts by weight of the composition $(Ba_{0.920}Ca_{0.080})_{1.0022}(Ti_{0.930}Zr_{0.070})O_3$ on a metal basis.

Bismuth oxide was weighed such that the content of Bi of the second auxiliary component was 0.260 parts by weight based on 100 parts by weight of the composition $(Ba_{0.920}Ca_{0.080})_{1.0022}(Ti_{0.930}Zr_{0.070})O_3$ on a metal basis.

Silicon dioxide and boron oxide were weighed as the fourth auxiliary component such that the contents of Si and B were respectively 0.033 parts by weight and 0.017 parts by weight based on 100 parts by weight of the composition $(Ba_{0.920}Ca_{0.080})_{1.0022}(Ti_{0.930}Zr_{0.070})_3$ on a metal basis.

These weighed powders were mixed with PVB. The resulting mixture was formed into a green sheet having a thickness of 50 μm by a doctor blade method.

A conductive paste for an internal electrode was printed on the green sheet. As the conductive paste, a Ag70%-Pd30% (Ag/Pd=2.33) alloy paste was used. Nine green sheets each provided with the conductive paste were laminated to give a layered product. The layered product was fired at 1200° C. for 4 hours to obtain a sintered compact.

The composition of the piezoelectric material part of the resulting sintered compact was evaluated by ICP emission spectrometric analysis. The results demonstrated that the metal oxide represented by chemical formula: $(Ba_{0.920}Ca_{0.080})_{1.0022}(Ti_{0.930}Zr_{0.070})O_3$ was the main component, and 0.150 parts by weight of Mn and 0.260 parts by weight of Bi based on 100 parts by weight of the main component were contained. The composition of Ba, Ca, Ti, Zr, Mn, Bi, Si, and B after sintering was the same as the weighed composition. It was also demonstrated that the content of Mg was 0.0001 parts by weight based on 100 parts by weight in terms of chemical formula: $(Ba_{1-x}Ca_x)_a(Ti_{1-y}Zr_y)O_3$.

The sintered compact was cut into a size of 10×2.5 mm. The side faces were ground, and a pair of external electrodes (a first electrode and a second electrode) for alternately short-circuiting the internal electrodes was formed by sputtering Au to produce a multilayered piezoelectric element as shown in FIG. 2B.

The multilayered piezoelectric element was composed of nine piezoelectric material layers and eight internal electrode layers. The internal electrodes of the resulting multilayered piezoelectric element were observed, and it was confirmed that Ag—Pd, as the electrode material, and the piezoelectric material were alternately formed.

Prior to evaluation of piezoelectric properties, the multilayered piezoelectric element sample was subjected to polarization treatment. Specifically, the sample was heated to 100° C. to 150° C. on a hot plate, an electric field of 14 kV/cm was applied between the first and the second electrodes for 30 minutes, and the temperature was decreased to room temperature while applying the electric field.

Evaluation of the piezoelectric properties of the resulting multilayered piezoelectric element demonstrated that insulation properties and piezoelectric properties equivalent to those of the ceramic of Example 1 were maintained even in the laminate structure.

multilayered piezoelectric elements that were similarly produced except that Ni or Cu was used as the internal electrodes and that the sintering was performed in a low oxygen atmosphere could have equivalent piezoelectric properties.

Comparative Example 14

A multilayered piezoelectric element was produced as in Example 25 except that the composition was the same as that in Comparative Example 11, the firing temperature was 1300° C., and the internal electrodes were made of a Ag95%-Pd5% (Ag/Pd=19) alloy. The internal electrodes were observed with a scanning electron microscope. The results demonstrated that the internal electrodes were molten and were scattered in an island-like configuration. Consequently, since the internal electrodes were not connected, polarization could not be performed. Therefore, the piezoelectric properties could not be evaluated.

Comparative Example 15

A multilayered piezoelectric element was produced as in Comparative Example 14 except that the internal electrodes were made of a Ag5%-Pd95% (Ag/Pd=0.05) alloy. The internal electrodes were observed with a scanning electron microscope. Ag—Pd as the electrode material was not sufficiently sintered. Consequently, since the internal electrodes were not connected, polarization could not be performed. Therefore, the piezoelectric properties could not be evaluated.

Example 26

A liquid discharge head shown in FIGS. 3A and 3B was produced using a piezoelectric element including the piezoelectric material of Example 1. Discharge of an ink according to input electric signals was confirmed. Discharge of a non-aqueous ink was tried by driving the liquid discharge head in a thermostat at 0° C., and discharge of the ink with the same efficiency as that at room temperature was confirmed with a lower voltage than that at the room temperature.

Example 27

A liquid discharge device shown in FIG. 4 was produced using the liquid discharge head of Example 26. Discharge of an ink according to input electric signals was confirmed. Discharge of a non-aqueous ink was tried by driving the liquid discharge device in a thermostat at 0° C., and discharge of the ink onto a recording medium with the same efficiency as that at room temperature was confirmed with a lower voltage than that at the room temperature.

Example 28

An ultrasonic motor shown in FIG. 6A was produced using a piezoelectric element including the piezoelectric material of Example 1. Rotation of the motor according to application of an alternating voltage was confirmed. When the ultrasonic motor was driven in a thermostat at −30° C., rotation of the motor with a higher efficiency than that at room temperature was confirmed.

Comparative Example 16

An ultrasonic motor shown in FIG. 6A was produced using a comparative element including the metal oxide material of Comparative Example 11. Although rotation of the motor according to application of an alternating voltage was confirmed at room temperature, rotation of the motor was not confirmed in a thermostat at −30° C. even by increasing the applied voltage.

Example 29

An optical apparatus shown in FIGS. 7A and 7B was produced using the ultrasonic motor in Example 28. Auto-focus operation according to application of an alternating voltage was confirmed. When the optical apparatus was driven in a thermostat at −30° C., autofocus operation equivalent to that at room temperature was confirmed.

Example 30

A dust removing device shown in FIGS. 9A and 9B was produced using a piezoelectric element including the piezoelectric material of Example 1. A satisfactory dust removing efficiency for dispersed plastic beads was confirmed by applying an alternating voltage. When the dust removing device was driven in a thermostat at −30° C., dust removing efficiency higher than that at room temperature was confirmed.

Example 31

An image pickup device shown in FIG. 12 was produced using the dust removing device of Example 30. In the operation of the device, dust on the surface of the image pickup unit was satisfactorily removed to provide a dust defect-free image. When the image pickup device was driven in a thermostat at −30° C., an image equivalent to that at room temperature was obtained.

Example 32

An electronic apparatus shown in FIG. 14 was produced using the piezoelectric element of Example 1. Loudspeaker operation according to application of an alternating voltage was confirmed. When the electronic apparatus was driven in a thermostat at −30° C., loudspeaker operation equivalent to that at room temperature was achieved.

Example 33

A liquid discharge head shown in FIGS. 3A and 3B was produced using the piezoelectric element of Example 25. Discharge of an ink according to input electric signals was confirmed. Discharge of a non-aqueous ink was tried by driving the liquid discharge head in a thermostat at 0° C., and discharge of the ink with the same efficiency as that at room temperature was confirmed with a lower voltage than that at the room temperature.

Example 34

A liquid discharge device shown in FIG. 4 was produced using the liquid discharge head of Example 33. Discharge of an ink according to input electric signals was confirmed. Discharge of a non-aqueous ink was tried by driving the liquid discharge device in a thermostat at 0° C., and discharge of the ink onto a recording medium with the same efficiency as that at room temperature was confirmed with a lower voltage than that at the room temperature.

Example 35

An ultrasonic motor shown in FIG. 6B was produced using the piezoelectric element of Example 21. Rotation of the motor according to application of an alternating voltage was confirmed. When the ultrasonic motor was driven in a thermostat at −30° C., rotation of the motor with a higher efficiency than that at room temperature was confirmed.

Example 36

An optical apparatus shown in FIGS. 7A and 7B was produced using the ultrasonic motor of Example 28. Autofocus operation according to application of an alternating voltage was confirmed. When the optical apparatus was driven in a thermostat at −30° C., autofocus operation equivalent to that at room temperature was confirmed.

Example 37

A dust removing device shown in FIGS. 9A and 9B was produced using the multilayered piezoelectric element of Example 25. A satisfactory dust removing efficiency for dispersed plastic beads was confirmed by applying an alternating voltage. When the dust removing device was driven in a thermostat at −30° C., dust removing efficiency higher than that at room temperature was confirmed.

Example 38

An image pickup device shown in FIG. 12 was produced using the dust removing device of Example 37. In the operation of the device, dust on the surface of the image pickup unit was satisfactorily removed to provide a dust defect-free image. When the image pickup device was driven in a thermostat at −30° C., an image equivalent to that at room temperature was obtained.

Example 39

An electronic apparatus shown in FIG. 14 was produced using the multilayered piezoelectric element of Example 25. Loudspeaker operation according to application of an alternating voltage was confirmed. When the electronic apparatus was driven in a thermostat at −30° C., loudspeaker operation equivalent to that at room temperature was achieved.

The piezoelectric material of the present invention has satisfactory piezoelectric constant and mechanical quality factor in a device driving temperature range (−30° C. to 50° C.) Since the piezoelectric material does not contain lead, its load on the environment is low. Accordingly, the piezoelectric material of the present invention can be used in various apparatuses including a large amount of the piezoelectric material, such as liquid discharge heads, ultrasonic motors, and dust removing devices, without any problem.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-146307, filed Jul. 12, 2013, which is hereby incorporated by reference herein in its entirety.

What is claimed is:

1. A piezoelectric material comprising:
a main component containing a perovskite-type metal oxide represented by Formula 1, a first auxiliary component composed of Mn, and a second auxiliary component composed of Bi or Bi and Li, wherein
the content of Mn is 0.040 parts by weight or more and 0.500 parts by weight or less based on 100 parts by weight of the metal oxide on a metal basis; and the content of Bi is 0.042 parts by weight or more and 0.850 parts by weight or less and the content of Li is 0.028 parts by weight or less (including 0 parts by weight) based on 100 parts by weight of the metal oxide on a metal basis, $(Ba_{1-x}Ca_x)_a(Ti_{1-y}Zr_y)O_3$ ... (1), wherein, $0.030 \leq x < 0.090$, $0.030 \leq y \leq 0.080$, and $0.9860 \leq a \leq 1.0200$.

2. The piezoelectric material according to claim 1, further comprising a third auxiliary component composed of Mg, wherein
the content of the third auxiliary component is 0.10 parts by weight or less (excluding 0 parts by weight) based on 100 parts by weight of the perovskite-type metal oxide represented by Formula 1 on a metal basis.

3. The piezoelectric material according to claim 1, further comprising a fourth auxiliary component composed of at least one of Si and B, wherein
the content of the fourth auxiliary component is 0.001 parts by weight or more and 4.000 parts by weight or less based on 100 parts by weight of the perovskite-type metal oxide represented by Formula 1 on a metal basis.

4. The piezoelectric material according to claim 1, wherein the crystal grains constituting the piezoelectric material have an average equivalent circular diameter of 500 nm or more and 10 μm or less.

5. The piezoelectric material according to claim 1, having a relative density of 93% or more and 100% or less.

6. The piezoelectric material according to claim 1, having a dielectric loss of 0.006 or less at a frequency of 1 kHz.

7. A piezoelectric element at least comprising:
a first electrode,
a piezoelectric material part, and
a second electrode,
wherein the piezoelectric material constituting the piezoelectric material part is the piezoelectric material according to claim 1.

8. A multilayered piezoelectric element comprising alternately laminated piezoelectric material layers and electrode layers each including an internal electrode, wherein the piezoelectric material layers are made of the piezoelectric material according to claim 1.

9. The multilayered piezoelectric element according to claim 8, wherein the internal electrode contains Ag and Pd such that the weight ratio M1/M2 of the content M1 of Ag to the content M2 of Pd is $0.25 \leq M1/M2 \leq 4.0$.

10. The multilayered piezoelectric element according to claim 8, wherein the internal electrode contains at least one of Ni and Cu.

11. A liquid discharge head at least comprising a liquid chamber provided with a vibrating unit including the piezoelectric element according to claim 7 and a discharge port communicating with the liquid chamber.

12. A liquid discharge device comprising a conveying unit for conveying a recording medium and the liquid discharge head according to claim 11.

13. An ultrasonic motor at least comprising a vibratory body including the piezoelectric element according to claim 7 and a moving body being in contact with the vibratory body.

14. An optical apparatus comprising the ultrasonic motor according to claim 13 in the driving unit.

15. A vibratory device comprising a vibratory body including a diaphragm provided with the piezoelectric element according to claim 7.

16. A dust removing device comprising a vibrating unit provided with the vibratory device according to claim 15.

17. An image pickup device at least comprising the dust removing device according to claim 16 and an image pickup element unit, wherein the diaphragm of the dust removing device is disposed on the light-receiving surface side of the image pickup element unit.

18. An electronic apparatus comprising a piezoelectric acoustic component including the piezoelectric element according to claim 7.

19. A liquid discharge head at least comprising a liquid chamber provided with a vibrating unit including the multilayered piezoelectric element according to claim 8 and a discharge port communicating with the liquid chamber.

20. A liquid discharge head comprising a conveying unit for conveying a recording medium and the liquid discharge head according to claim 19.

21. An ultrasonic motor at least comprising a vibratory body including the multilayered piezoelectric element according to claim 8 and a moving body being in contact with the vibratory body.

22. An optical apparatus comprising the ultrasonic motor according to claim 21 in the driving unit.

23. A vibratory device comprising a vibratory body including a diaphragm provided with the multilayered piezoelectric element according to claim 8.

24. A dust removing device comprising a vibrating unit provided with the vibratory device according to claim 23.

25. An image pickup device at least comprising the dust removing device according to claim 24 and an image pickup element unit, wherein the diaphragm of the dust removing device is disposed on the light-receiving surface side of the image pickup element unit.

26. An electronic apparatus comprising a piezoelectric acoustic component including the multilayered piezoelectric element according to claim 8.

\* \* \* \* \*